United States Patent
Kim et al.

(10) Patent No.: US 9,837,155 B1
(45) Date of Patent: Dec. 5, 2017

(54) DUAL GATE SEMICONDUCTOR MEMORY DEVICE WITH VERTICAL SEMICONDUCTOR COLUMN

(71) Applicant: Korea University Research and Business Foundation, Seoul (KR)

(72) Inventors: Sangsig Kim, Seoul (KR); Youngin Jeon, Gyeonggi-do (KR); Minsuk Kim, Gyeonggi-do (KR); Doohyeok Lim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/185,388

(22) Filed: Jun. 17, 2016

(30) Foreign Application Priority Data

May 12, 2016 (KR) .......................... 10-2016-0057961

(51) Int. Cl.
| | |
|---|---|
| G11C 16/04 | (2006.01) |
| G11C 14/00 | (2006.01) |
| G11C 11/39 | (2006.01) |
| H01L 27/102 | (2006.01) |
| H01L 27/08 | (2006.01) |
| G11C 11/56 | (2006.01) |
| H01L 27/108 | (2006.01) |

(52) U.S. Cl.
CPC .......... *G11C 14/0018* (2013.01); *G11C 11/39* (2013.01); *G11C 11/5628* (2013.01); *G11C 11/5671* (2013.01); *H01L 27/0817* (2013.01); *H01L 27/1027* (2013.01); *H01L 27/10844* (2013.01)

(58) Field of Classification Search
CPC . G11C 14/0018; G11C 11/39; G11C 11/5628; G11C 11/5671
USPC ....................................... 365/185.18, 185.05
See application file for complete search history.

(56) References Cited

U.S. PATENT DOCUMENTS

2016/0284750 A1* 9/2016 Ionescu ............ H01L 27/14616

* cited by examiner

*Primary Examiner* — Huan Hoang
(74) *Attorney, Agent, or Firm* — Jenkins, Wilson, Taylor & Hunt, P.A.

(57) ABSTRACT

A memory device includes: a semiconductor column extending vertically on a substrate and including a source region of a first conductivity type, an intrinsic region, and a drain region of a second conductivity type; a first gate electrode disposed adjacent to the drain region to cover the intrinsic region; a second gate electrode spaced apart from the first gate electrode and disposed adjacent to the source region to cover the intrinsic region; a first gate insulating layer disposed between the first gate electrode and the intrinsic region; and a second gate insulating layer disposed between the second gate electrode and the intrinsic region.

17 Claims, 28 Drawing Sheets

DUAL GATE SEMICONDUCTOR MEMORY DEVICE WITH VERTICAL SEMICONDUCTOR COLUMN

CROSS-REFERENCE TO RELATED APPLICATIONS

This U.S. non-provisional application claims priority under 35 U.S.C. §119 to Korea Patent Application No. 10-2016-0057961 filed on May 12, 2016, the entirety of which is hereby incorporated by reference herein.

TECHNICAL FIELD

The present disclosure relates generally to semiconductor memory devices and, more particularly, to a dual gate semiconductor memory device with a vertical semiconductor column structure and a selective volatile/nonvolatile mode operating semiconductor memory device using the same.

BACKGROUND

Conventional semiconductor memory devices may be classified into volatile memory devices such as DRAM and nonvolatile memory devices such as flash memory.

In case of a conventional volatile memory device, particularly, a DRAM memory device, its integration is basically limited due to a one-transistor one-capacitor (1T-1C) unit cell structure and problems such as increase in an aspect ratio (A/R) of a capacitor and leakage current occur according to the integration. As a result, power required for periodical refresh is consumed to cause limitations in integration and storage capacity per unit cell of the memory device.

A nonvolatile memory device, i.e., a flash memory device has basic problems as follows. A gentle current-voltage (I-V) characteristic curve is formed due to a subthreshold swing (SS) of 60 mV/dec. When data is read, a data error occurs due to a small current sensing margin. In addition, read/write characteristics are degraded due to a high gate voltage and a threshold voltage value varies during read/write operations to cause data distortion. Furthermore, memory characteristics vary depending on duration of use.

Accordingly, through a capacitorless one-transistor (1T) semiconductor memory device as a novel nonvolatile DRAM memory device, there is a need for developing a novel nonvolatile memory device having a more integrated cell structure, a long refresh period according to improved information retention characteristics and decrease in leakage current, and low power consumption that a low operating voltage requires per unit cell structure.

However, it is becoming difficult to keep pace with the high-capacity trend resulting from spread of demand for handheld digital devices and emergence of new digital multifunctional apparatuses in which various functions are combined. In recent years, integration of memory devices has a limitation due to various performance degradations (e.g., decrease in SS value, increase in leakage current, increase in power consumption, etc.) caused by short-channel effect that occurs as conventional memory devices are scaled down. Studies such as technical application of strain engineering, high-k dielectrics, and metal gate have been conducted to overcome the above problems. However, complex processes and high costs are still problematic.

Moreover, a conventional volatile DRAM memory device or a conventional flash memory device has a structure that is capable of utilizing only its own characteristics. Hence, when volatile or nonvolatile operation characteristics are selectively required, memory devices may not be flexibly utilized. This is a basic problem of the conventional volatile DRAM memory device or the conventional flash memory device.

Accordingly, there is a need for developing a novel memory device which may be scaled down and integrated with a simple structure, reduce leakage current to have features of low power and high efficiency, and secure a sufficient read sensing margin even in a narrow memory window. In this regard, there are needs for a low applied voltage during write/erase operations, operating voltage characteristics required per low unit cell structure in which a sufficient current sensing margin may be secured even in a narrow memory window due to a high on-off current ratio and a low subthreshold swing (SS), and capable of implementing volatile/nonvolatile operation characteristics in one device. Moreover, there is a pressing need for developing a nanostructure-based device having superior electrical/physical/structural characteristics.

SUMMARY

Example embodiments of the present disclosure provide a semiconductor memory device that is scaled down and integrated with a simple structure, reduces leakage current to have features of low power and high efficiency, and includes a novel vertical semiconductor column structure where a sufficient current sensing margin or a read sensing margin may be secured even in a narrow memory window, and a selective volatile/nonvolatile mode operating semiconductor memory device using the same.

Specifically, example embodiments of the present disclosure provide a semiconductor memory device that requires a low applied voltage during write/erase operations, has a high on-off current ratio and a low subthreshold swing (SS) to secure a sufficient current sensing margin even in a narrow memory window, has operation voltage characteristics required per low unit cell structure, and includes a novel nanostructure where volatile/nonvolatile operation characteristics may be implemented in a single device, and a selective volatile/nonvolatile mode operating semiconductor memory device using the same.

A memory device according to an example embodiment of the present disclosure includes: a semiconductor column extending vertically on a substrate and including a source region of a first conductivity type, an intrinsic region, and a drain region of a second conductivity type; a first gate electrode disposed adjacent to the drain region to cover the intrinsic region; a second gate electrode spaced apart from the first gate electrode and disposed adjacent to the source region to cover the intrinsic region; a first gate insulating layer disposed between the first gate electrode and the intrinsic region; and a second gate insulating layer disposed between the second gate electrode and the intrinsic region.

In an example embodiment of the present disclosure, the first conductivity type may be n-type and the second conductivity type may be p-type.

In an example embodiment of the present disclosure, the substrate may include an active region and a device isolation layer, the source region of the first conductivity type may be disposed in contact with the active region, and the active region may be doped with impurities of the first conductivity type.

In an example embodiment of the present disclosure, the memory device may further include: a source insulating layer disposed between a top surface of the substrate and a bottom surface of the semiconductor column; and a source line disposed between the source insulating layer and the bottom surface of the semiconductor. The source line may be a semiconductor doped with impurities of the first conductivity type.

In an example embodiment of the present disclosure, the memory device may further include: a bitline disposed on the drain region of the semiconductor column. The first gate electrode and the second gate electrode may extend on a disposition surface in a first direction, and the bitline may extend on a disposition surface of the substrate in a second direction perpendicular to the first direction.

In an example embodiment of the present disclosure, the memory device may further include: a first charge storage layer disposed between the first gate insulating layer and the first gate electrode; a first auxiliary gate insulating layer disposed between the first charge storage layer and the first gate electrode; a second charge storage layer disposed between the second gate insulating layer and the second gate electrode; and a second auxiliary gate insulating layer disposed between the second charge storage layer and the second gate electrode.

A memory device according to an example embodiment of the present disclosure includes: device isolation layers extending on a substrate parallel to each other in a first direction; source lines each having the same top surface as the device isolation layer, disposed between the device isolation layers, and extending parallel to each other in the first direction; semiconductor columns disposed periodically on the source lines and extending vertically on the substrate; first wordlines disposed to cover side surfaces of the semiconductor columns arranged in the first direction and extending in the first direction; second wordlines spaced vertically apart from the first wordlines, disposed to cover the side surfaces of the semiconductor columns arranged in the first direction, and extending in the first direction; a first gate insulating layer disposed between the semiconductor column and the first wordline to cover a side surface of the semiconductor column; a second gate insulating layer disposed between the semiconductor column and the second wordline to cover a side surface of the semiconductor column; gate isolation layers extending in the first direction and filling spaces between the first wordlines and the second wordlines; and a bitline extending in the second direction in contact with top surface of the semiconductor columns arranged in a second direction perpendicular to the first direction. The semiconductor column may include a source region of a first conductivity type, a drain region of a second conductivity type, and an intrinsic region formed between the source region and the drain region. The source region may be in contact with the source line, and the drain region may be in contact with the bitline.

In an example embodiment of the present disclosure, the memory device may further include: a first charge storage layer disposed between the first wordline and the first gate insulating layer; a first auxiliary gate insulating layer disposed between the first charge storage layer and the first wordline; a second charge storage layer disposed between the second wordline and the second gate insulating layer; and a second auxiliary gate insulating layer disposed between the second charge storage layer and the second wordline.

In an example embodiment of the present disclosure, the memory device may further include: a lower insulating layer disposed between the second wordline and the substrate; an upper insulating layer disposed between the first wordline and the bitline; and a middle insulating layer disposed between the first wordline and the second wordline. The first charge storage layer may extend to be interposed between the middle insulating layer and the first wordline, the first auxiliary gate insulating layer may extend to be interposed between the upper insulating layer and the first wordline, the first auxiliary gate insulating layer may extend to be interposed between the middle insulating layer and the first wordline, the second charge storage layer may extend to be interposed between the middle insulating layer and the second wordline, the second charge storage layer may extend to be interposed between the lower insulating layer and the second wordline, the second auxiliary gate insulating layer may extend to be interposed between the middle insulating layer and the second wordline, and the second auxiliary gate insulating layer may extend to be interposed between the lower insulating layer and the second wordline.

A memory device according to an example embodiment of the present disclosure includes: source lines extending on a substrate parallel to each other in a first direction; a source line insulating layer disposed between the source lines and the substrate; semiconductor columns disposed periodically on the source lines and extending vertically on the substrate; first wordlines disposed to cover surfaces of the semiconductor columns arranged in the first direction and extending in the first direction; second wordlines spaced vertically apart from the first wordlines, disposed to cover side surfaces of the semiconductor columns arranged in the first direction, and extending in the first direction; a first gate insulating layer disposed between the semiconductor column and the first wordline to cover a side surface of the semiconductor column; gate isolation layers extending in the first direction and filling spaces between the first wordlines and the second wordlines; and a bitline being in contact with top surfaces of the semiconductor columns arranged in a second direction perpendicular to the first direction and extending in the second direction. The semiconductor column may include a source region of a first conductivity type, a drain region of a second conductivity type, and an intrinsic region disposed between the source region and the drain region. The source region may be in contact with the source line, and the drain region may be in contact with the bitline.

In an example embodiment of the present disclosure, the memory device may further include: a first charge storage layer disposed between the first wordline and the first gate insulating layer; a first auxiliary gate insulating layer disposed between the first charge storage layer and the first wordline; a second charge storage layer disposed between the second wordline and the second gate insulating layer; and a second auxiliary gate insulating layer disposed between the second charge storage layer and the second wordline.

A memory device according to an example embodiment of the present disclosure includes: a semiconductor column extending vertically on a substrate and including a source region of a first conductivity type, an intrinsic region, and a drain region of a second conductivity type; a first gate electrode disposed adjacent to the drain region to cover the intrinsic region; a second gate electrode spaced apart from the first gate electrode and disposed adjacent to the source region to cover the intrinsic region; a first gate electrode disposed between the first gate electrode and the intrinsic region; and a second gate insulating layer disposed between the second gate electrode and the intrinsic region. An operating method of the memory device includes: applying a gate bias voltage to the first gate electrode; applying a first gate voltage to the second gate electrode and applying a first drain voltage to the drain region to write a first logic state such that the first memory device indicates the first logic state while the gate bias voltage is applied; applying a second gate voltage to the second gate electrode and applying a second drain voltage to the drain region such that the first logic state is maintained while the gate bias voltage is applied; applying the second gate voltage to the second gate electrode and applying the first drain voltage to the drain region such that the first logic state is read while the gate bias voltage is applied; applying a third gate voltage to the second gate electrode and applying the first drain voltage to the drain region to write a second logic state such that the memory device indicates the second logic state while the gate bias voltage is applied; applying the second gate voltage to the second gate electrode and applying the second drain voltage to the drain region such that the second logic state is maintained while the gate bias voltage is applied; and applying the second gate voltage to the second gate electrode and applying the first drain voltage to the drain region such that the second logic state is read while the gate bias voltage is applied.

In an example embodiment of the present disclosure, the first conductive layer may be n-type, the second conductivity type may be p-type, the gate bias voltage may be between 1 volt and 3 volts, the first gate voltage may be between −0.25 volt and −1 volt, the second gate voltage may be between −0.1 volt and 0.1 volt, and the third gate voltage may be between 0.25 volt and 1 volt.

A memory device according to an example embodiment of the present disclosure includes: a semiconductor column extending vertically on a substrate and including a source region of a first conductivity type, an intrinsic region, and a drain region of a second conductivity type; a first gate electrode disposed adjacent to the drain region to cover the intrinsic region; a second gate electrode spaced apart from the first gate electrode and disposed adjacent to the source region to cover the intrinsic region; a first gate electrode disposed between the first gate electrode and the intrinsic region; and a second gate insulating layer disposed between the second gate electrode and the intrinsic region. An operating method of the memory device includes: applying a gate bias voltage to the second gate electrode; applying a first gate voltage to the first gate electrode and applying a first drain voltage to the drain region to write a first logic state such that the first memory device indicates the first logic state while the gate bias voltage is applied; applying a second gate voltage to the first gate electrode and applying a second drain voltage to the drain region such that the first logic state is maintained while the gate bias voltage is applied; applying the second gate voltage to the first gate electrode and applying the drain voltage to the drain region such that the first logic state is read while the gate bias voltage is applied; applying a third gate voltage to the first gate electrode and applying the first drain voltage to the drain region to write a second logic state such that the memory device indicates the second logic state while the gate bias voltage is applied; applying the second gate voltage to the first gate electrode and applying the second drain voltage to the drain region such that the second logic state is maintained while the gate bias voltage is applied; and applying the second gate voltage to the first gate electrode and applying the first drain voltage to the drain region such that the second logic state is read while the gate bias voltage is applied.

In an example embodiment of the present disclosure, the first conductive layer may be n-type, the second conductivity type may be p-type, the gate bias voltage may be between −1 volt and −3 volts, the first gate voltage may be between 0.25 volt and 1 volt, the second gate voltage may be between −0.1 volt and 0.1 volt, and the third gate voltage may be between −0.25 volt and −1 volt.

A memory device according to an example embodiment of the present disclosure includes: a semiconductor column including a source region of a first conductivity type extending vertically on a substrate, a drain region of a second conductivity type, and an intrinsic region formed between the source region and the drain region; a first gate electrode disposed to cover the intrinsic region; a second gate electrode spaced vertically apart from the first gate electrode and disposed to cover the intrinsic region; a first gate insulating layer disposed between the first gate electrode and the intrinsic region; a first charge storage layer; a first auxiliary gate insulating layer; a second gate insulating layer disposed between the second gate electrode and the intrinsic region; a second charge layer; and a second auxiliary gate insulating layer. An operating method of the memory device includes: applying a first gate voltage to the first gate electrode and applying a first drain voltage to the drain region to write first logic state such that the memory device indicates the first logic state; applying a second gate voltage to the second gate electrode and applying a second drain voltage to the drain region such that the first logic state is maintained; applying the second gate voltage to the first gate electrode and applying the first drain voltage to the drain region such that the first logic state is read; applying a third gate voltage to the first gate electrode and applying the first drain voltage to the drain region such that the memory device indicates a second logic state; applying the second gate voltage to the first gate electrode and applying the second drain voltage to the drain region such that the second logic state is maintained; and applying the second gate voltage to the first gate electrode and applying the first drain voltage to the drain region such that the second logic state is read.

In an example embodiment of the present disclosure, the operating method may further include: applying a program gate voltage to the second gate electrode and applying a drain voltage to the source region such that charges are injected into the second charge storage layer; and applying an erase gate voltage to the second gate voltage such that the charge injected into the second charge storage layer are removed.

In an example embodiment of the present disclosure, the first conductive layer may be n-type, the second conductivity type may be p-type, the first gate voltage may be between −0.25 volt and −1 volt, the second gate voltage may be between −0.1 volt and 0.1 volt, and the third gate voltage may be between 0.25 volt and 1 volt.

A fabricating method of a memory device according to an example embodiment of the present disclosure includes: forming a device isolation layer extending in a first direction on a substrate to define an active region; stacking a first interlayer dielectric, a second interlayer dielectric, a third interlayer dielectric, a fourth interlayer dielectric, and a fifth interlayer dielectric on the substrate where the active region is formed and forming a through-hole through the first interlayer dielectric, the second interlayer dielectric, the third interlayer dielectric, the fourth interlayer dielectric, and the fifth interlayer dielectric; growing a semiconductor column including a source region of a first conductivity type, an intrinsic region, and a drain region of a second conductivity type in the through-hole; forming a trench to penetrate the fifth interlayer dielectric, the fourth interlayer dielectric, the third interlayer dielectric, and the second interlayer dielectric between the semiconductor columns arranged in the first direction and to extend in the first direction; forming a gate insulating layer on an exposed side surface of the semiconductor column after removing the second interlayer dielectric and the fourth interlayer dielectric; filling a portion where the second interlayer dielectric and the fourth interlayer dielectric are removed and the trench with a conductor; removing the conductor filling the trench to form a first gate electrode and a second gate electrode and to form an auxiliary trench; filling the auxiliary trench with an insulator; and forming a bitline to be in contact with the drain region of the semiconductor column and to extend in a second direction perpendicular to the first direction.

In an example embodiment of the present disclosure, the fabricating method may further include: forming a charge storage layer at a portion where the second interlayer dielectric and the fourth interlayer dielectric are removed and the trench after forming the gate insulating layer; and forming an auxiliary gate insulating layer at a portion where the second interlayer dielectric and the fourth interlayer dielectric are removed and the trench after forming the charge storage layer.

A fabricating method of a memory device according to an example embodiment of the present disclosure includes: patterning a source line extending in a first direction on a substrate with a source line insulating layer interposed therebetween; stacking a first interlayer dielectric, a second interlayer dielectric, a third interlayer dielectric, a fourth interlayer dielectric, and a fifth interlayer dielectric on the substrate where the source line is formed and forming a through-hole through the fifth interlayer dielectric, the fourth interlayer dielectric, the third interlayer dielectric, the second interlayer dielectric, and the interlayer dielectric; growing a semiconductor column including a source region of a first conductivity type, an intrinsic region, and a drain region of a second conductivity type in the through-hole; forming a trench to penetrate the fifth interlayer dielectric, the fourth interlayer dielectric, the third interlayer dielectric, and the second interlayer dielectric between the semiconductor columns arranged in the first direction and to extend in the first direction; forming a gate insulating layer on an exposed side surface of the semiconductor column after removing the second interlayer dielectric and the fourth interlayer dielectric; filling a portion where the second interlayer dielectric and the fourth interlayer dielectric are removed and the trench with a conductor; removing the conductor filling the trench to form a first gate electrode and a second gate electrode and to form an auxiliary trench; filling the auxiliary trench with an insulator; and forming a bitline to be in contact with the drain region of the semiconductor column and to extend in a second direction perpendicular to the first direction.

In an example embodiment of the present disclosure, the fabricating method may further include: forming a charge storage layer at a portion where the second interlayer dielectric and the fourth interlayer dielectric are removed and the trench after forming the gate insulating layer; and forming an auxiliary gate insulating layer at a portion where the second interlayer dielectric and the fourth interlayer dielectric are removed and the trench after forming the charge storage layer.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
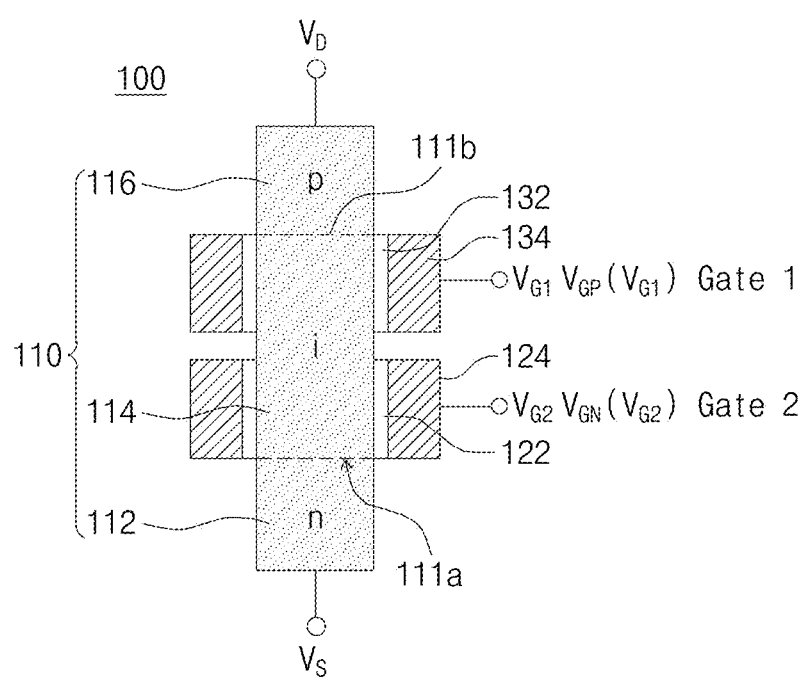
FIG. 1 is a structure diagram illustrating a basic structure of a memory device according to an example embodiment of the present disclosure.

A three-terminal semiconductor rectifier is conventionally called a thyristor. The thyristor is a gate controlled p-n-p-n diode. Unlike a conventional MOS-FET, a positive feedback field effect transistor (FB-FET) is a transistor in which a source and a drain have different conductivity types. An FB-FET may operate as a capacitorless DRAM. The FB-FET is also referred to as a thyristor dynamic random access memory (T-DRAM).

Conventionally, a unit cell of a DRAM includes one capacitor and one MOSFET. The capacitor needs a large space to store lots of charges. Therefore, a conventional 1T-1C DRAM cannot implement a three-dimensional stacked structure.

According to an example embodiment of the present disclosure, a vertical semiconductor memory of a T-DRAM structure is proposed.

According to an example embodiment of the present disclosure, a vertical semiconductor memory of a T-DRAM structure may operate as an erasable programmable read-only memory (EPROM) when a floating gate or a charge trap layer is additionally disposed between a gate electrode and a gate insulating layer. Thus, the vertical semiconductor memory may operate as a T-DRAM or an EPROM.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

FIG. 1 is a structure diagram illustrating a basic structure of a memory device according to an example embodiment of the present disclosure.

Figure 2:
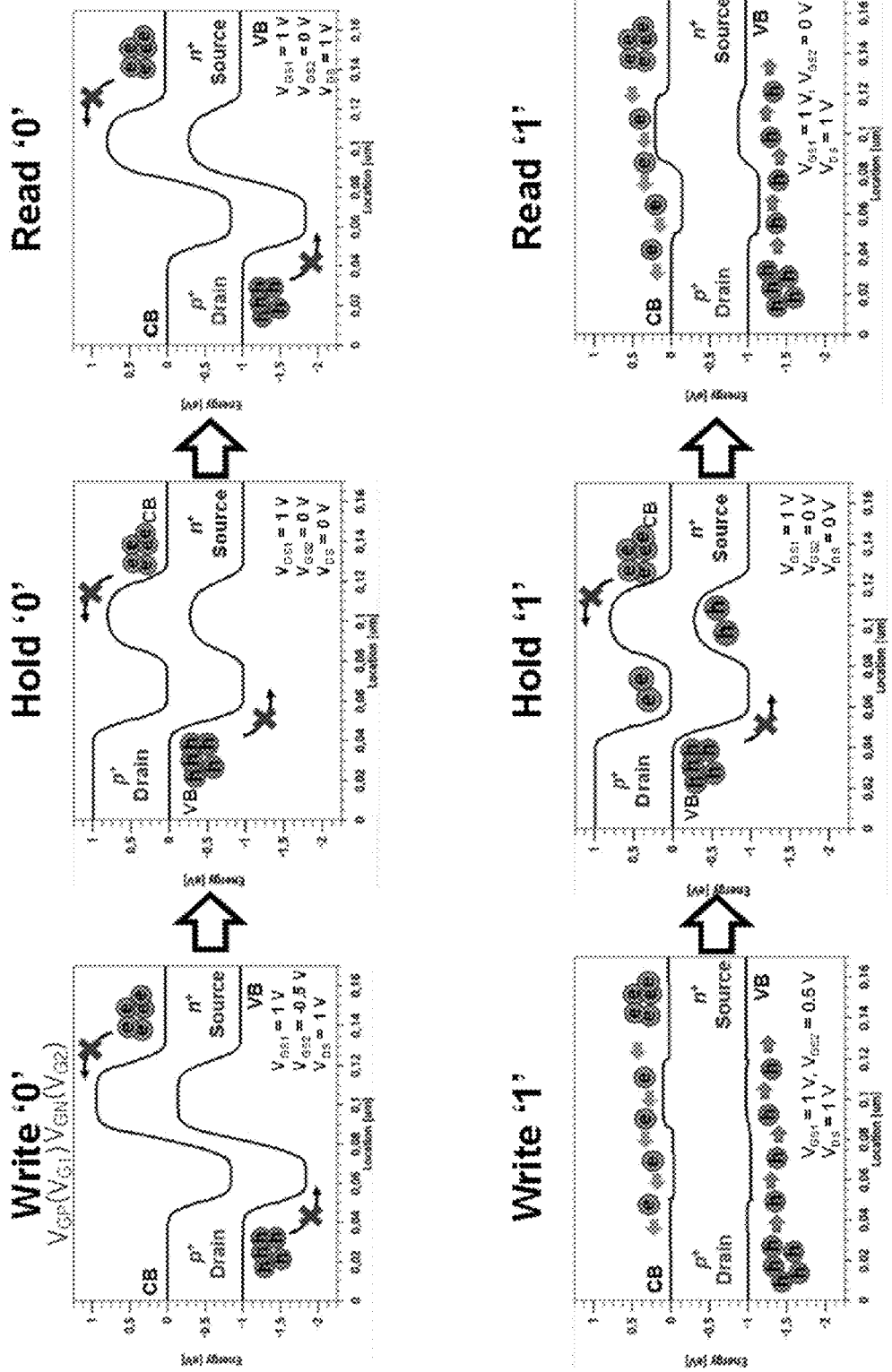
FIG. 2 illustrates a band diagram depending on voltages applied to a drain, a source, and a gate of the memory device in FIG. 1.

FIG. 2 illustrates a band diagram depending on voltages applied to a drain, a source, and a gate of the memory device in FIG. 1.

Figure 3:
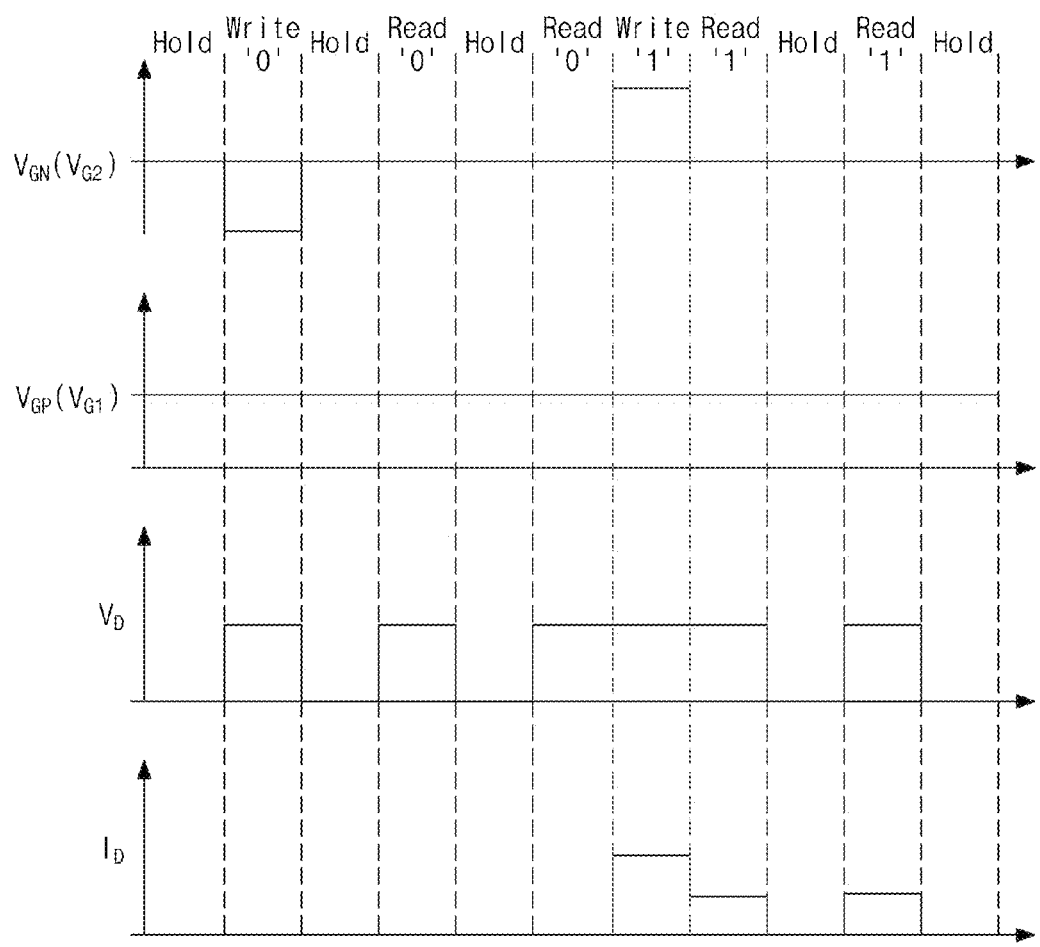
FIG. 3 is a timing chart illustrating voltages and currents depending on a write operation, a hold operation, and a read operation of a memory device (n channel mode) in FIG. 2.

FIG. 3 is a timing chart illustrating voltages and currents depending on a write operation, a hold operation, and a read operation of a memory device (n channel mode) in FIG. 2.

Figure 4:
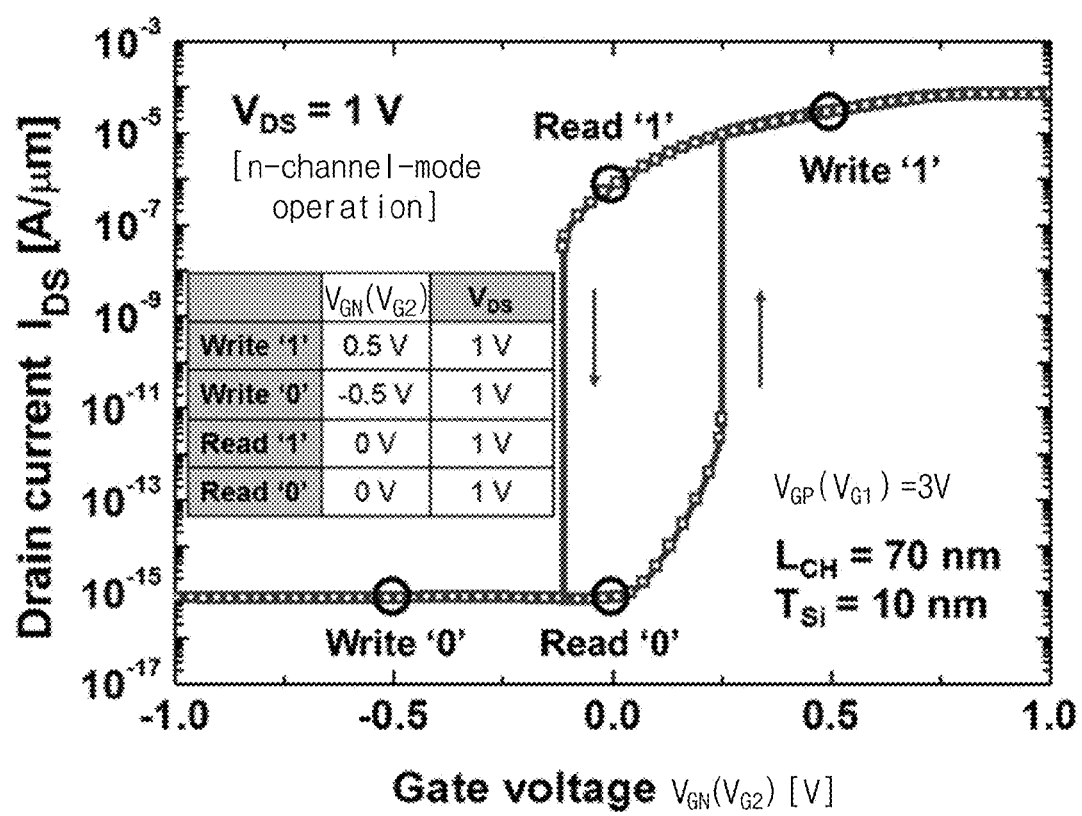
FIG. 4 is a graph illustrating drain current depending on a gate voltage of the memory device in FIG. 3.

FIG. 4 is a graph illustrating drain current depending on a gate voltage of the memory device in FIG. 3.

Figure 5:
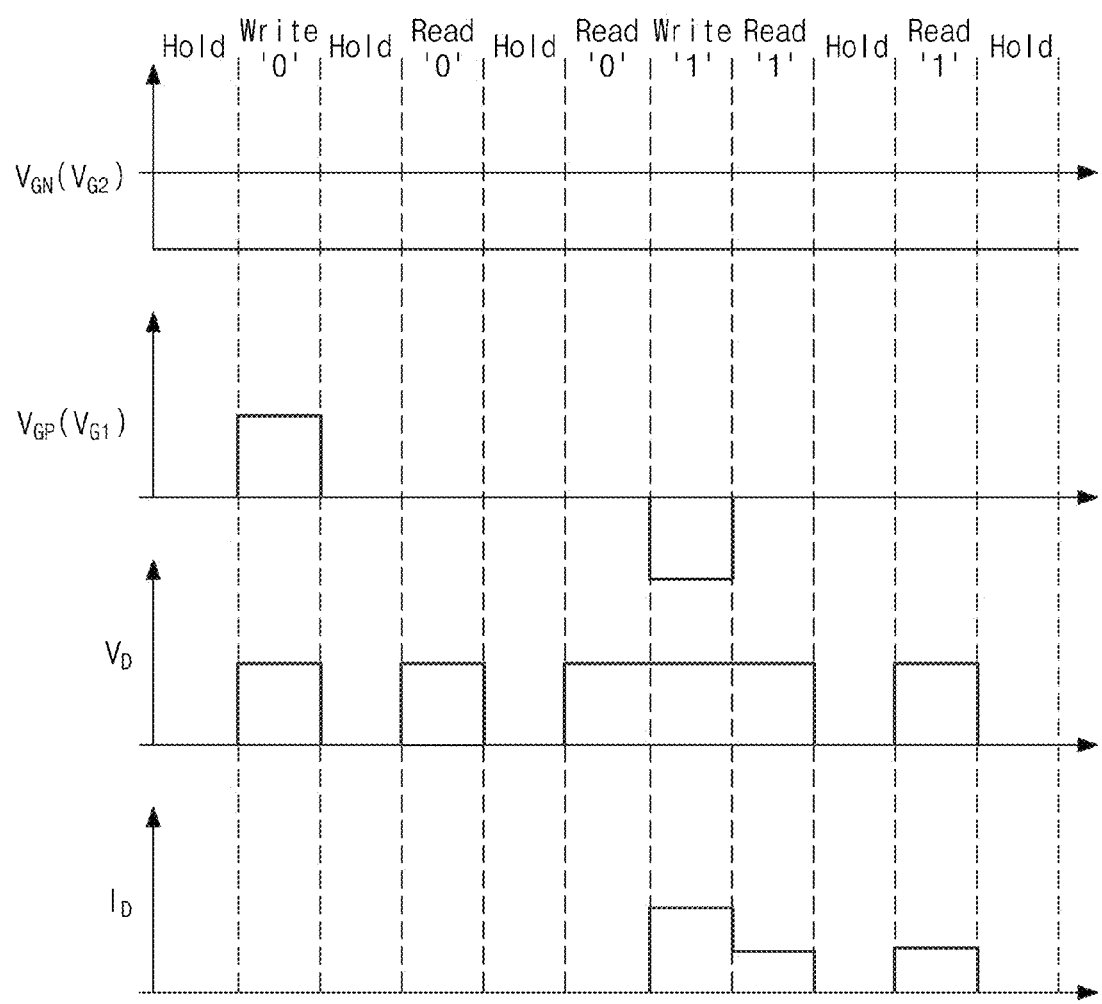
FIG. 5 is a timing chart illustrating voltages and currents depending on a write operation, a hold operation, and a read operation of the memory device (p channel mode) in FIG. 2.

FIG. 5 is a timing chart illustrating voltages and currents depending on a write operation, a hold operation, and a read operation of the memory device (p channel mode) in FIG. 2.

Figure 6:
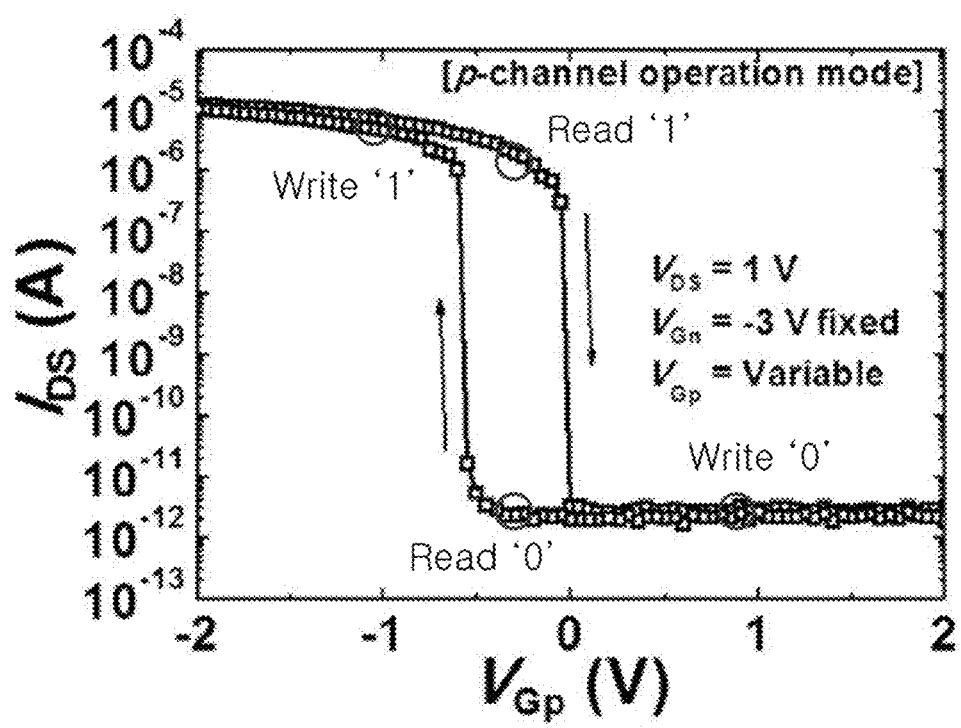
FIG. 6 is a graph illustrating drain current depending on a gate voltage of the memory device in FIG. 5.

FIG. 6 is a graph illustrating drain current depending on a gate voltage of the memory device in FIG. 5.

Referring to FIGS. 1 to 6, a vertical memory device 100 includes a vertical semiconductor column 110, a first gate electrode 134, a second gate electrode 124, a first gate insulating layer 132, and a second gate insulating layer 122. The vertical semiconductor column 110 includes a source region 112 of a first conductivity type, an intrinsic region 114, and a drain region 116 of a second conductivity type that vertically extend on a substrate and are sequentially arranged. The first gate electrode 134 is disposed adjacent to the drain region 116 to cover the intrinsic region 114. The second gate electrode 124 is disposed to be vertically spaced apart from the first gate electrode 134 and disposed adjacent to the source region 112 to cover the intrinsic region 114. The first gate insulating layer 132 is disposed between the first gate electrode 134 and the intrinsic region 114. The second gate insulating layer 122 is disposed between the second gate electrode 124 and the intrinsic region 114. The first gate electrode 134 is disposed adjacent to the drain region 116, and the second gate electrode 124 is disposed adjacent to the source region 112.

First, the operation principle of a semiconductor memory device according to an example embodiment of the present disclosure will now be described below.

The memory device 100 has a p-i-n structure. The source region 112 may be heavily doped with impurities of the first conductivity type ($n^+$). The intrinsic region 114 may not be doped. The drain region 116 may be heavily doped with impurities of the second conductivity type ($p^+$).

When a voltage is not applied to the first gate electrode 134 and the second gate electrode 124 and a potential difference does not occur between the drain region and the source region 112, all regions have the same Fermi level.

In a $p^+$-i-$n^+$ structure, the drain region 116 is in a $p^+$ state, the source region 112 is in an $n^+$ state, and the intrinsic region 114 is in an intrinsic state. The superscript "+" means high-concentration doping. The $p^+$-i-$n^+$ structure includes an n-i junction 111a and a p-i junction 111b.

The memory device 100 according to an example embodiment of the present disclosure may perform a hold operation to maintain a state established by a write operation, a read operation, and a write operation. Thus, the semiconductor memory device 100 may operate as a DRAM. A gate G may be used interchangeably with a gate electrode, a source S may be used interchangeably with a source region, and a drain D may be used interchangeably with a drain region.

One of the first and second gate electrodes 134 and 124 may operate a memory device according to an applied voltage, and the other gate electrode may always be maintained at a gate bias voltage to form an energy barrier. For example, an n channel operation mode may be established by applying a gate bias voltage to the first gate electrode 134 and applying an operation voltage to the second gate electrode 124. Thus, a p-i-n structure may change into a p-n-p-n structure.

Meanwhile, a p channel operation mode may be established by applying a gate bias voltage to the second gate electrode 124 and applying an operation voltage to the first gate electrode 134. Thus, a p-i-n structure may change into a p-n-p-n structure.

In a DRAM, a logic state may be expressed as a first logic state ('0') and a second logic state ('1'). For example, the gate bias voltage of about 3 volts may always be applied to the first gate electrode 134. When a first gate voltage of $V_{G2}=-0.5$ volt is applied to the second gate electrode 124 and a first drain voltage of $V_{DS}=1$ volt is applied to the drain to write a logic '0' state, an energy barrier of the intrinsic region 114 facing the second gate electrode 124 increases to make it difficult for electrons of a conduction band to jump over the energy barrier. In addition, an energy barrier of the n–1 junction 111a increases to make it difficult for holes of a valence band to jump over the energy barrier. Thus, almost no drain current $I_{DS}$ flows through the semiconductor column 110.

To maintain a logic '0' state while a gate bias voltage of about 3 volts is always applied to the first gate electrode 134, a second gate voltage of $V_{G2}=0$ volt is applied to the second gate electrode 124 and a second drain voltage of $V_{DS}=0$ volt is applied to the drain. Even in this case, almost no drain current $I_{DS}$ flows through the semiconductor column 110 due to the energy barrier.

To read a logic '0' state, a second gate voltage of $V_{G2}=0$ volt may be applied to the second gate electrode 124 and a first drain voltage of $V_{DS}=1$ volt may be applied to the drain. Even in this case, the drain current $I_{DS}$ flowing through the semiconductor column 110 almost does not flow due to the energy barrier. Thus, a current detection circuit (not shown) connected to the drain may check the logic '0' state.

To write a logic '1' while a gate bias voltage of about 3 volts is always applied to the first gate electrode 134, a third gate voltage of $V_{G2}=0.5$ volt may be applied to the second gate electrode 124 and a first drain voltage of $V_{DS}=1$ volt may be applied to the drain. In this case, an energy barrier of the n-i junction 111a is lowered and an energy barrier of the p-i junction 111b is also lowered. Thus, electrons and holes may flow through the semiconductor column 110.

To maintain the logic '1' state, a second gate voltage of $V_{G2}=0.0$ volt may be applied to the second gate electrode 124 and a second drain voltage of $V_{DS}=0$ volt may be applied to the drain. In this case, a conduction band energy well is formed and electrons are bound in an intrinsic region facing the first gate electrode 134. Additionally, a valence band energy well is formed and holes are bound in an intrinsic region facing the second gate electrode 124. Since the conduction band energy well and the valence band energy well provide a sufficient energy well, almost no drain current $I_{DS}$ flows.

To read the '1' state, a second gate voltage of $V_{GS}=0.0$ V may be applied to the second gate electrode 124 and a first drain voltage of $V_{DS}=1$ volt may be applied to the drain. In the intrinsic region facing the second gate electrode 124, the electrons bounded to the conduction band energy well change the energy band to lower the energy barrier. In the intrinsic region facing the first gate electrode 134, the holes bounded to the valence band energy well change the energy band to lower the energy barrier. Thus, the drain current $I_{DS}$ flows through the semiconductor column.

Referring to FIG. 4, in an n channel operation mode, a current on/off ratio is $10^{11}$ and a subthreshold swing (SS) is about 0.1 mV/dec. Drain current depending on a gate voltage exhibits a hysteresis and has capacitorless memory characteristics according to predetermined operation conditions.

Accordingly, the memory device 100 may be used as a capacitorless DRAM. Hereinafter, a structure and an operating method of a capacitorless DRAM will now be described.

A p-i-n structure changes into a p-n-p-n structure as a gate bias voltage is applied to a gate electrode. A gate bias voltage applied to the first gate electrode 134 may be between 1 volt and 3 volts. The first gate voltage applied to the second gate electrode 124 may be between −0.25 volt and −1 volt, the second gate voltage may be between −0.1 volt and 0.1 volt, and the third gate voltage may be between 0.25 volt and 1 volt. In addition, the first drain may be between 0.1 volt and 1 volt and the second drain voltage may be 0 volt.

In the memory device 100, an energy barrier in a channel has the same structure as a p-n-p-n (or p-n-i-n) structure due to a potential barrier formed in the channel. Under a specific bias condition, some charges are accumulated in the channel while charges are injected. Thus, a feedback loop is created concurrently with rapid elimination of the potential barrier. This phenomenon causes window characteristics to be exhibited when the memory device 100 operates, and a memory window may be maintained while the charges accumulated in the channel exist.

In a modified embodiment of the present disclosure, the structure of the memory device 100 may change into an n-i-p structure.

In a modified embodiment of the present disclosure, the memory device 100 may further include a first charge storage layer and a first auxiliary gate electrode between the first gate electrode 134 and the first gate insulating layer 132. The memory device 100 may further include a second charge layer and a second auxiliary gate electrode between the second gate electrode 124 and the second gate insulating layer 122. In this case, a gate electrode contributes to formation of a potential barrier in a channel and the charge storage layer may store charges. The charge storage layer and the gate electrode may change the potential barrier in the channel (or semiconductor column) to create a positive feedback loop and may be used in memory characteristics.

When a specific voltage condition (program or erase condition) is applied to a memory device, charges in a channel are stored in a charge storage layer or charges stored in the charge storage layer are released to the channel. Through the procedure, height of a potential barrier in the channel or threshold voltage shift characteristics change. Since charges in the charge storage layer may be retained for a long period of time, the memory device has nonvolatile memory characteristics.

An FB-RAM according to an example embodiment of the present disclosure may selectively perform volatile and nonvolatile memory functions in a single device. When performing nonvolatile memory functions, the FB-RAM may form a potential barrier only with a gate voltage while no charge is stored in the charge storage layer to form a nonvolatile memory window. Thus, a role of a volatile/nonvolatile operation conversion switch may be played depending on whether charges are stored in a charge storage layer of the FB-RAM.

Referring to FIGS. 5 and 6, a memory device may perform a p-channel operation.

In a DRAM, a logic state may be displayed as a first logic state ('0') and a second logic state ('1'). For example, a gate bias voltage of about −3 volt may always be applied to the second gate electrode 124. When a first gate voltage of $V_{G1}=+0.5$ volt is applied to the first gate electrode 134 and a first drain voltage of $V_{DS}=1V$ is applied to the drain to write a logic '0' state, an energy barrier is formed and electrons, and thus it is difficult for electrons and holes to jump over the energy barrier. As a result, almost no drain current $I_{DS}$ flows through the semiconductor column 110.

To maintain the logic '0' state while a gate bias voltage of about 3 volts is always applied to the second gate electrode 124, a second gate voltage of $V_{G1}=0$ volt may be applied to the first gate electrode 134 and a second drain voltage of $V_{DS}=0$ volt may be applied to the drain. In this case, the drain current IDS flowing through the semiconductor column almost does not flow due to the energy barrier. Thus, a current detection circuit (not shown) connected to the drain may check the logic '0' state.

To write the logic '1' state while a gate bias voltage of about 3 volts is always applied to the second gate electrode 124, a third gate voltage of $V_{G2}=-0.5$ volt may be applied to the first gate electrode 134 and a first drain voltage of $V_{DS}=1$ volt may be applied to the drain. In this case, the energy barrier is lowered. Thus, electrons and holes may flow through the semiconductor column 110.

To maintain the logic '1' state, a second gate voltage of $V_{G2}=0.0$ volt may be applied to the first gate electrode 134 and a second drain voltage of $V_{DS}=0$ volt may be applied to the drain. In this case, an energy barrier is formed and thus almost no drain current $I_{DS}$ flows.

To read the logic '1' state, a second gate voltage of $V_{Gs}=0.0$ volt may be applied to the first gate electrode 134 and a first drain voltage of $V_{DS}=1$ volt may be applied to the drain. In this case, an energy barrier changes and thus drain current $I_{DS}$ flows through the semiconductor column 110.

Figure 7:
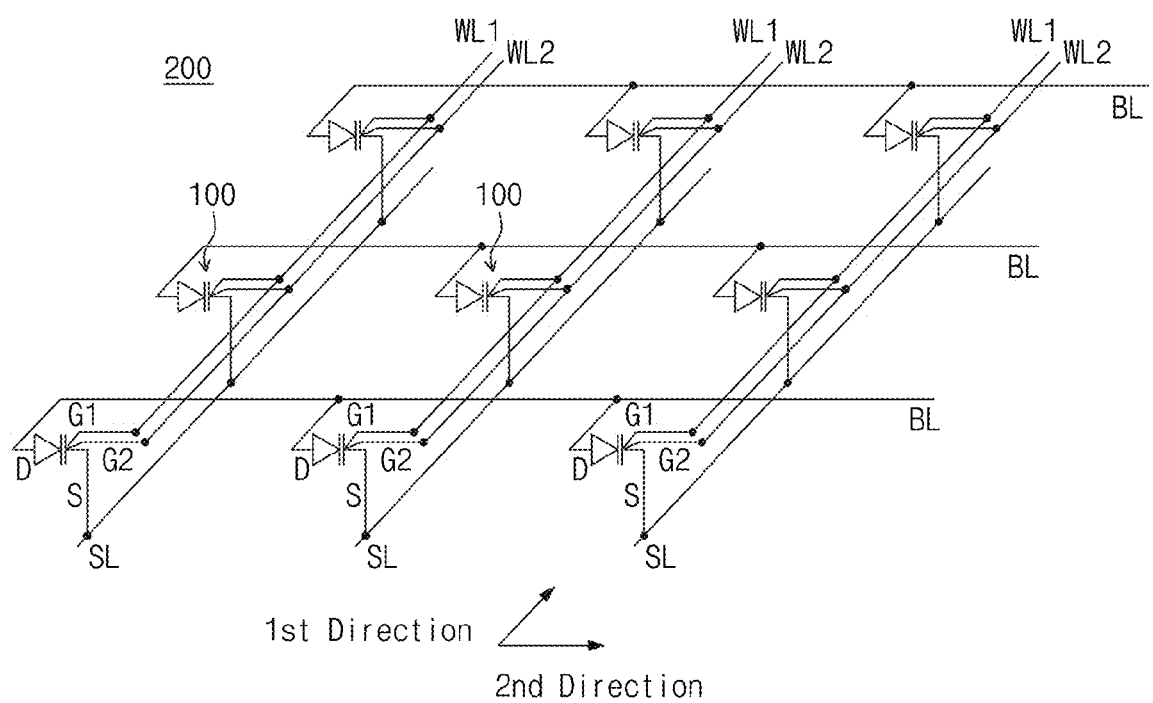
FIG. 7 is a circuit diagram of a capacitorless DRAM according to an example embodiment of the present disclosure.

FIG. 7 is a circuit diagram of a capacitorless DRAM according to an example embodiment of the present disclosure.

Figure 8:
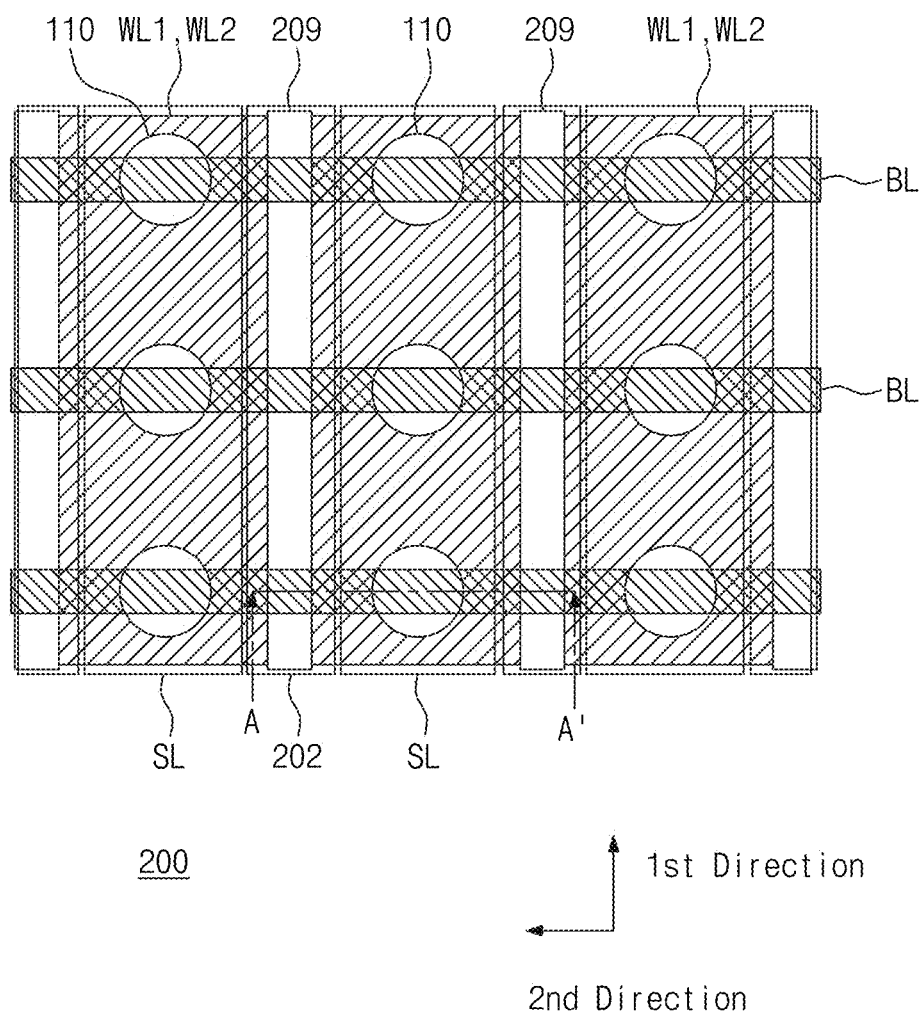
FIG. 8 is a top plan view illustrating a cell region of the capacitorless DRAM in FIG. 7.

FIG. 8 is a top plan view illustrating a cell region of the capacitorless DRAM in FIG. 7.

Figure 9:
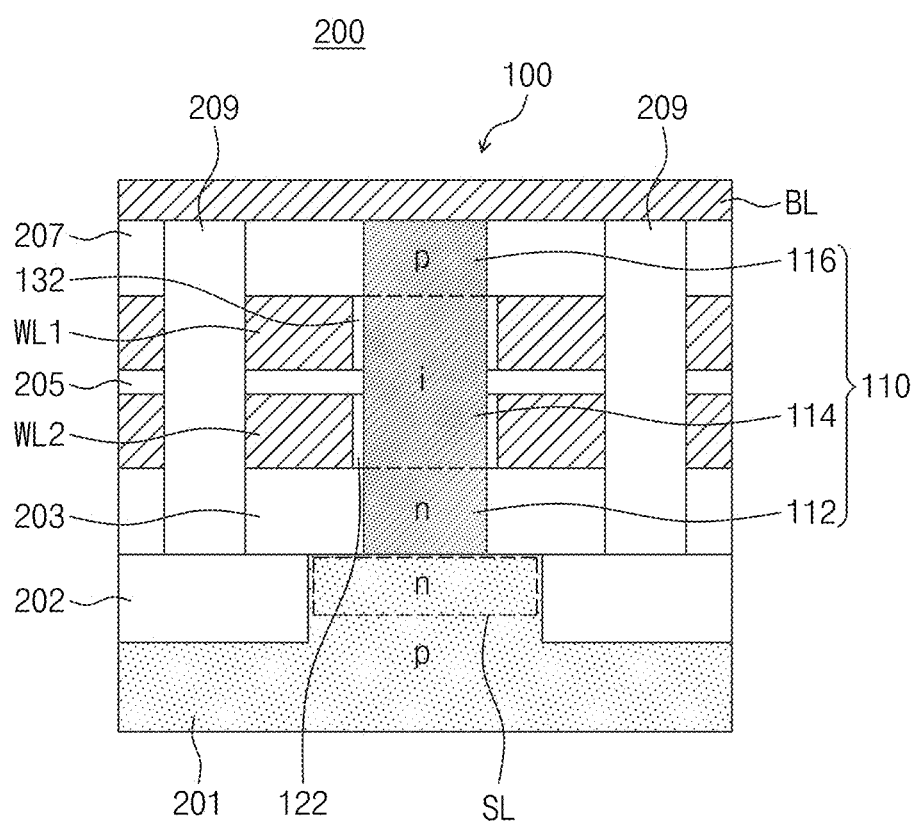
FIG. 9 is a cross-sectional view taken along the line A-A' in FIG. 8.

FIG. 9 is a cross-sectional view taken along the line A-A' in FIG. 8.

FIGS. 10A through 10I are cross-sectional views taken along the line A-A' in FIG. 8 according to process steps, respectively.

Referring to FIGS. 7 through 10, a capacitorless DRAM 200 includes a plurality of unit memory devices 100. The unit memory devices 100 are arranged in matrix, and a semiconductor column 110 of the memory device extends vertically from a substrate. Each of the unit memory devices 100 is a four-terminal device including a first gate G1, a second gate G2, a source S, and a drain D. The first gates G1 of the unit memory devices 100 arranged in a first direction are connected to a first wordline WL1, and the second gates G2 thereof are connected to second wordline WL2. The first wordline WL1 and the first gate G1 are formed in one body. The second gates and the second wordline WL2 are formed in one body. A drain of the unit memory device 100 arranged in a second direction is connected to a bitline BL. A source of the memory device 100 arranged in the first direction is connected to a source line SL. The source line SL may be grounded.

In case of an n channel operation mode, the first wordline WL1 may access each of the unit memory devices 100 when changing an energy barrier by a gate bas voltage and selecting the second wordline WL2 and a single bitline BL to apply voltages corresponding to a write operation, a hold operation, and a read operation.

In case of a p channel operation mode, the second wordline WL2 may access each of the unit memory devices 100 when changing an energy barrier by a gate bias voltage and selecting the second wordline WL2 and a single bitline BL to apply voltages corresponding to a write operation, a hold operation, and a read operation.

The unit memory device 100 includes a semiconductor column 110, a first gate electrode 134, a second gate electrode 124, a first gate insulating layer 132, and a second gate insulating layer 122. The semiconductor column 110 includes a source region 112 of a first conductivity type extending vertically on a substrate 201, a drain region 116 of a second conductivity type, and an intrinsic region 114 formed between the source region 112 and the drain region 116. The first gate electrode 134 is disposed adjacent to the drain region 116 and disposed to cover the intrinsic region 114. The second gate electrode 124 is disposed adjacent to the source region 112 and disposed to cover the intrinsic region 114. The first gate insulating layer 132 is disposed between the first gate electrode 134 and the intrinsic region 114, and the second gate 122 is disposed between the second gate electrode 124 and the intrinsic region 114.

The capacitorless DRAM 200 includes device isolation layers 202, source lines SL, semiconductor columns 110, first wordlines WL1, second wordlines WL2, a first gate insulating layer 132, a second gate insulating layer 122, gate isolation layers 209, and a bitline BL. The first gate electrode 134 may be commonly used in a plurality of transistors arranged in the first direction to constitute the first wordline WL1. The second gate electrode 124 may be commonly used in a plurality of transistors arranged in the first direction to constitute the second wordline WL2. The first wordline WL1 and the second wordline WL2 may be vertically aligned to extend parallel to each other in the first direction.

The device isolation layers 202 extend parallel to each other on the substrate 201 in the first direction. The source lines SL has the same top surface as the device isolation layer 202, is disposed between the device isolation layers 202, and extend parallel to each other in the first direction. The semiconductor columns 110 are periodically disposed on the source lines SL and extend vertically on the substrate 201. The first wordlines WL1 are disposed adjacent to the drain region 116 of the semiconductor column 110, is disposed to cover a side surface of the intrinsic region 114 of the semiconductor columns 110 arranged in the first direction, and extend in the first direction. The second wordlines WL2 are disposed adjacent to the source region 112 of the semiconductor column 110, are vertically spaced apart from the first wordlines WL1, are aligned with the first wordlines WL1, are disposed to cover a side surface of the intrinsic region 114 of the semiconductor columns 110, and extend in the first direction.

The first gate insulating layer 132 is disposed between the semiconductor column 110 and the first wordline WL1 to cover the side surface of the semiconductor column 110. The second gate insulating layer 122 is disposed between the semiconductor column 110 and the second wordline WL2 to cover the side surface of the semiconductor column 110.

The gate isolation layers 209 fill spaces between the first/second wordlines WL1/WL2 that extend in the first direction and are disposed to be spaced apart from each other in the second direction.

The bitline BL is in contact with top surfaces of the semiconductor columns 110 arranged in the second direction perpendicular to the first direction and extends in the second direction.

The semiconductor column 110 includes a source region of the first conductivity type, an intrinsic region, and a drain region of the second conductivity type that are sequentially stacked. The source region is in contact with the source line SL, and the drain region is in contact with the bitline BL. The first conductivity type may be n-type, and the second conductivity type may be p-type.

The substrate 201 may be a silicon substrate. The substrate 201 may be divided into a cell region in which unit memory cells are formed and a peripheral circuit region in which peripheral circuits are disposed. The cell region may be doped with impurities of the second conductivity type by an ion implantation process through a well process.

Each of the device isolation layers 202 may be a silicon oxide layer. The device isolation layers 202 may be formed by a shallow trench isolation (STI) process. The source lines SL may correspond to an active region defined by the STI process. The source lines SL may be formed by doping the active region with impurities of the first conductivity type.

The semiconductor columns may be formed of silicon by chemical vapor deposition (CVD) or epitaxial growth. The semiconductor columns 110 may be doped simultaneously with their growth to have a p-i-n structure or an n-i-p structure. The first/second wordlines WL1/WL2 may include at least one of heavily doped polysilicon, a metal, a metal alloy, metal silicide. Each of the first and second gate insulating layers 132 and 122 may be a silicon oxide layer or a silicon oxynitride layer. Each of the gate isolation layers 209 may be a silicon oxide layer or a silicon nitride layer. The bitline BL may include at least one of a metal, a metal alloy, and metal silicide.

A method for fabricating the capacitorless DRAM 200 will now be described in detail. A device isolation layer 202 extending in the first direction is formed on the substrate 201 to define an active region. The device isolation layer 202 may be formed by an STI process. The active region may be doped with impurities of the first conductivity type.

A first interlayer dielectric 203, a second interlayer dielectric 204, a third interlayer dielectric 205, a fourth interlayer dielectric 206, and a fifth interlayer dielectric 207 are stacked on the substrate 201 where the active region is formed. Each of the first, third, and fifth interlayer dielectrics 203, 205, and 207 may be a silicon oxide layer. Each of the second and fourth interlayer dielectrics 204 and 206 may be a silicon nitride layer.

A through-hole 110a is formed through the fifth interlayer dielectric 207, the fourth interlayer dielectric 206, the third interlayer dielectric 205, the second interlayer dielectric 204, and the first interlayer dielectric 201.

A semiconductor column 110 including a source region of a first conductivity type, an intrinsic region, and a drain region of a second conductivity type grows in the through-hole 110a. The semiconductor column 110 may be doped with impurities simultaneously with its growth or may be doped by ion implantation after its growth.

A trench 208a is formed to penetrate the fifth interlayer dielectric 207, the fourth interlayer dielectric 206, the third interlayer dielectric 205, the second interlayer dielectric 204, and the first interlayer dielectric 203 and to extend in the first direction 203 between the first semiconductor columns 110 arranged in the first direction. The trenches 208a may be periodically arranged between the semiconductor columns 110.

In a modified embodiment of the present disclosure, the trench 208a may not penetrate the first interlayer dielectric layer 203.

After the second interlayer dielectric 204 and the fourth interlayer dielectric 206 are removed, a first gate insulating layer 132 and a second gate insulating layer 134 are formed on exposed side surfaces of the semiconductor column 110, respectively. The first gate insulating layer 132 is formed in a region in which the fourth interlayer dielectric 206 is removed, and the second gate insulating layer 134 is formed in a region in which the second interlayer dielectric 204 is removed. The second interlayer dielectric 204 and the fourth interlayer dielectric 206 may be selectively removed by wet etching.

A conductor 208 fills the trench 208a and a portion where the second interlayer dielectric 204 and the fourth interlayer dielectric 206 are removed. The conductor 208 is a material used to form a gate electrode and may be doped polysilicon, a metal or a metal alloy. Preferably, the conductor 208 may be polysilicon or tantalum.

Then, the conductor 208 filling the trench 208a is removed to form a gate electrode (or wordline) and to form an auxiliary trench 209a. The gate electrode includes a first gate electrode and a second gate electrode. The first gate electrode extends in the first direction to form a first wordline WL1. The second gate electrode extends in the second direction to form a second wordline WL2.

Then, the auxiliary trench 209a is filled with an insulator to form a gate isolation layer 209. The gate isolation layer 209 may be a silicon oxide layer or a silicon nitride layer.

Then, a bitline BL is formed to be in contact with the drain region 116 of the semiconductor column 110 and to extend in the second direction perpendicular to the first direction.

Figure 10A:
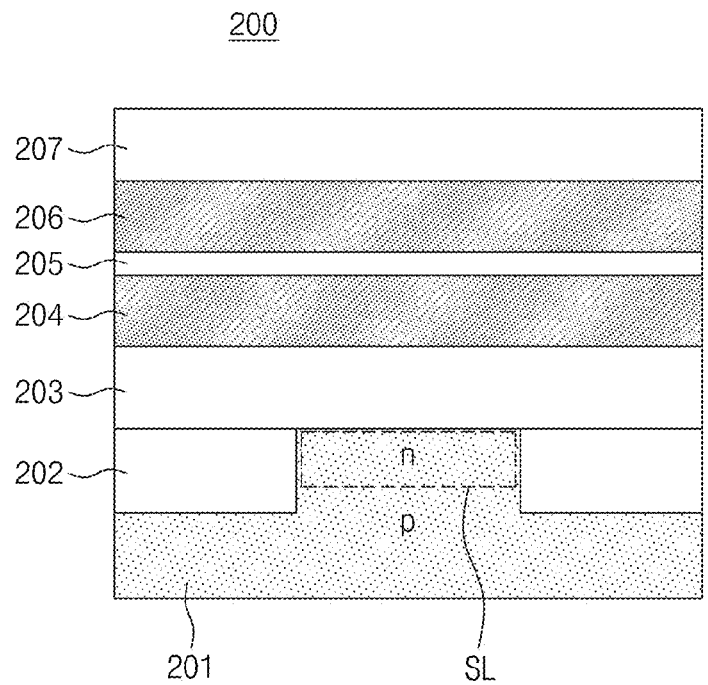
FIGS. 10A through 10I are cross-sectional views taken along the line A-A' in FIG. 8 according to process steps, respectively.

Referring to FIG. 10A, a device isolation layer 201 extending in a direction is formed on the substrate 201 to define an active region. A cell region and a peripheral circuit region are divided on the substrate 201 using a mask. Wells are formed in the cell region and the peripheral circuit region by ion implantation, respectively.

In the cell region, the device isolation layer 201 extending in the first direction is formed on the substrate 201. The device isolation layer 201 and the active region may be formed by a conventional STI process. The active region is a region exposed between adjacent device isolation layers and may be heavily doped with impurities of a first conductivity type by ion implantation. Thus, the active region may form the source line SL. The device isolation layer 201 may be a silicon oxide layer and include a silicon nitride layer on its top surface as an etch-stop layer (not shown).

A first interlayer dielectric 203, a second interlayer dielectric 204, a third interlayer dielectric 205, a fourth interlayer dielectric 206, and a fifth interlayer dielectric 207 are sequentially stacked on the substrate 201 where the source line SL is formed. Each of the first, third, and fifth interlayer dielectrics 203, 205, and 207 may be a silicon oxide layer, and each of the second and fourth interlayer dielectrics 204 and 206 may be a silicon oxide layer. Thickness of the third interlayer dielectric 205 may be smaller than that of the second interlayer dielectric 204 or the fourth interlayer dielectric 206.

Figure 10B:
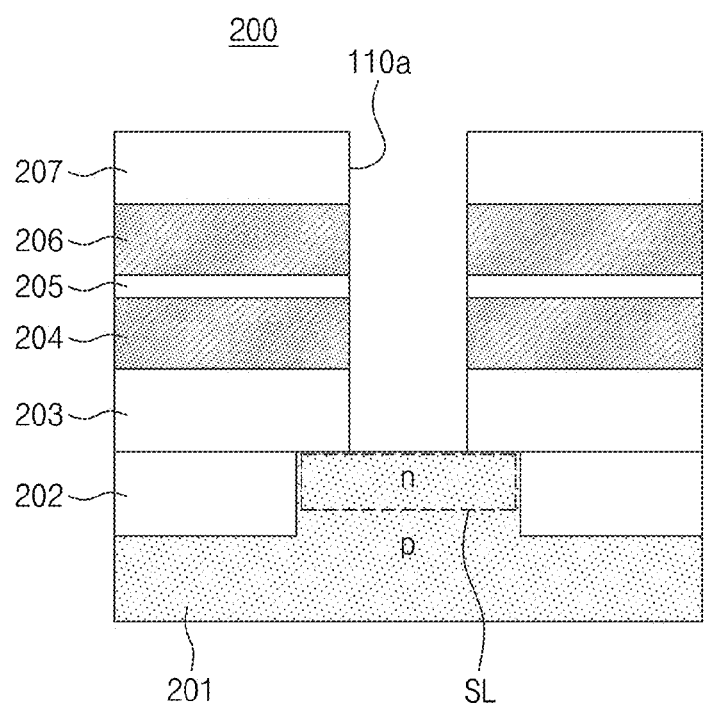

Referring to FIG. 10B, a through-hole 110a is formed by a patterning process to penetrate the fifth interlayer dielectric 207, the fourth interlayer dielectric 206, the third interlayer dielectric 205, the second interlayer dielectric 204, and the first interlayer dielectric 203. The trough-holes 110a may be periodically disposed on the source line SL in a matrix.

Figure 10C:
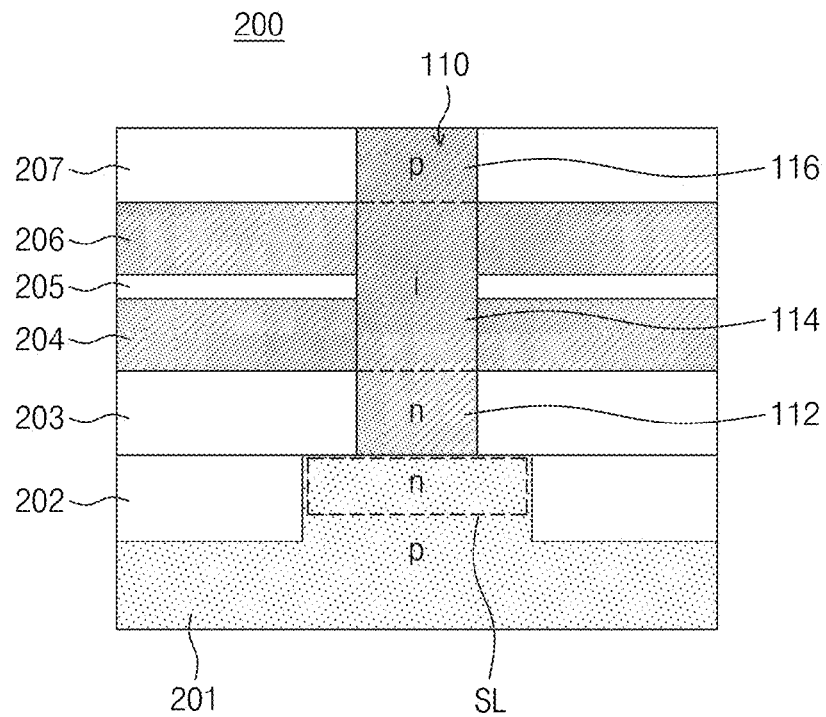

Referring to FIG. 10C, a semiconductor column 110 including a source region 112 of a first conductivity type, an intrinsic region 114, and a drain region 116 of a second conductivity type grows in the through-hole 100a. The intrinsic region 114 may be aligned with the second interlayer dielectric 204, the third interlayer dielectric 205, and the fourth interlayer dielectric 206. The semiconductor column 110 may be formed by a silicon epitaxial process or may be crystallized by depositing polysilicon and performing an annealing process. Doping may be performed during the silicon epitaxial process or may be performed by ion implantation after formation of a silicon column. A planarization process may be performed after the semiconductor column 110 fills the through-hole 110a.

Figure 10D:
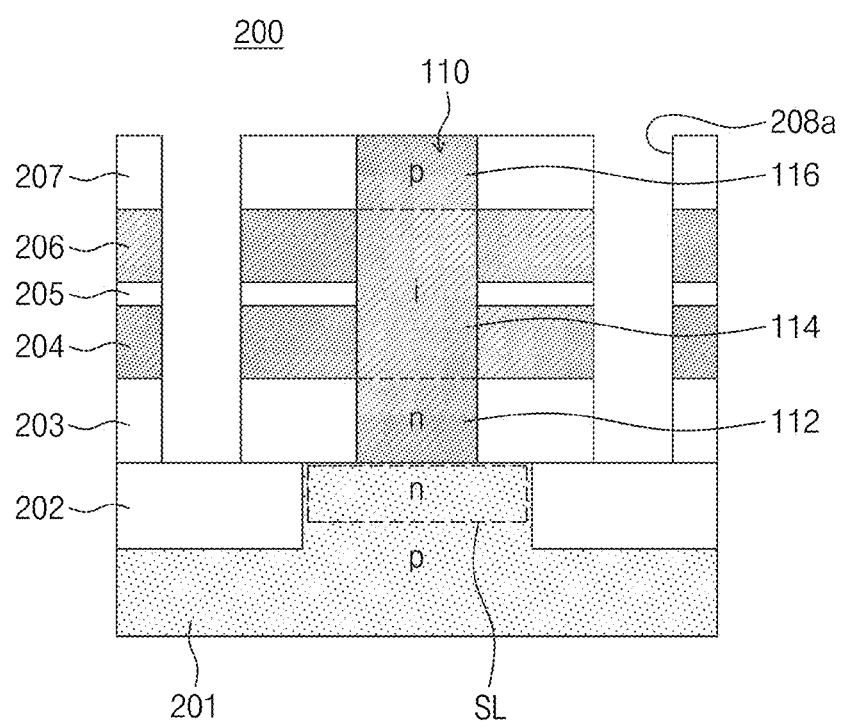

Referring to FIG. 10D, a trench 208a is formed to penetrate the fifth interlayer dielectric 207, the fourth interlayer dielectric 206, the third interlayer dielectric 205, the second interlayer dielectric 204, and the first interlayer dielectric 203 between the semiconductor columns 110 arranged in the first direction. The trench 208a extends in the first direction. The second interlayer dielectric 204 and the fourth interlayer dielectric 206 may be isolated from each other by extension of the trench 208a in the first direction.

Figure 10E:
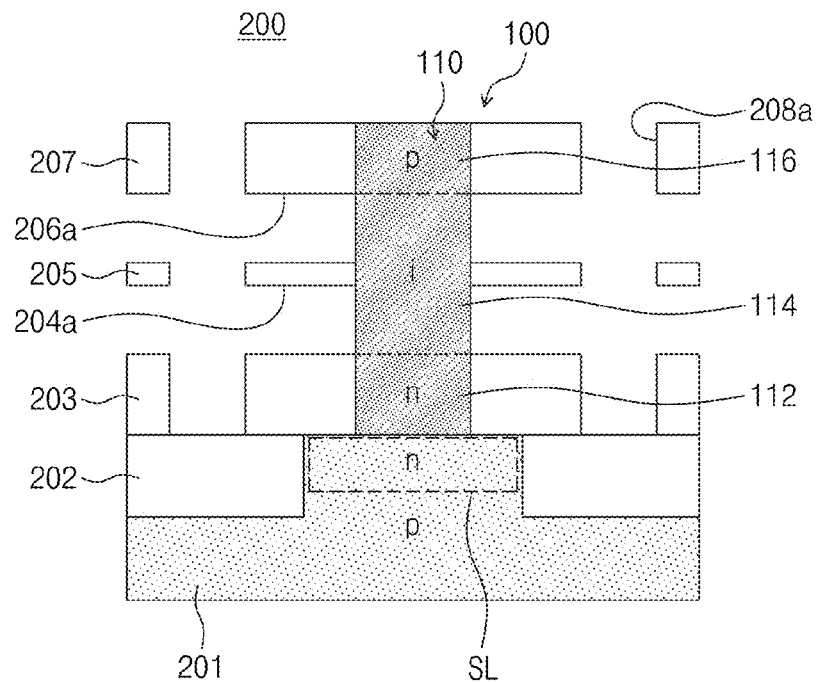

Referring to FIG. 10E, the second interlayer dielectric 204 and the fourth interlayer dielectric 206 may be selectively removed by wet etching.

Figure 10F:
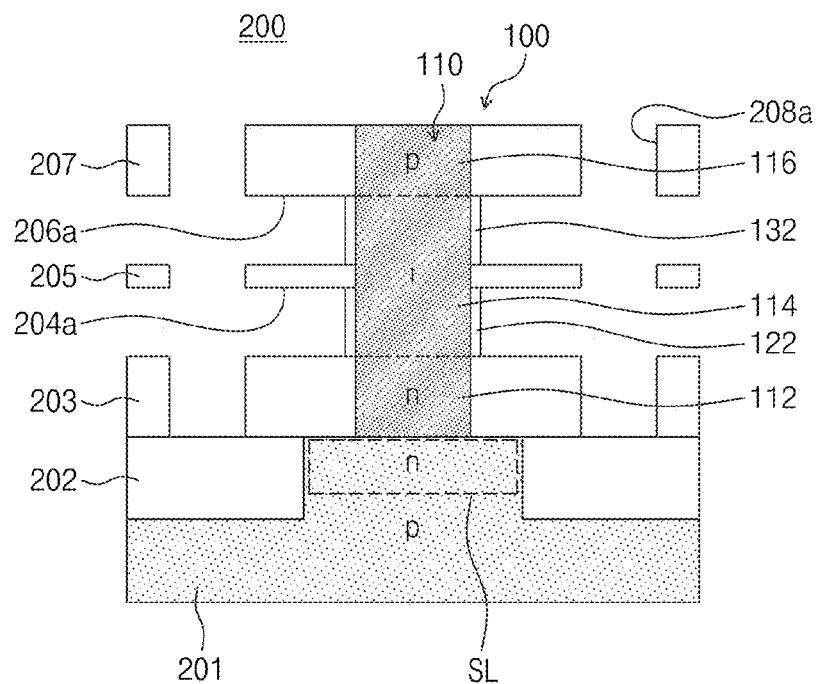

Referring to FIG. 10F, after the fourth interlayer dielectric 206 and the second interlayer dielectric 204 are removed, a first gate insulating layer 132 and a second gate insulating layer 122 are formed on exposed side surfaces of the semiconductor column 110, respectively. Each of the first and second gate insulating layers 132 and 122 may be a silicon oxide layer of about tens of nanometers (nm). The silicon oxide layer may be formed by a thermal oxidation process.

Figure 10G:
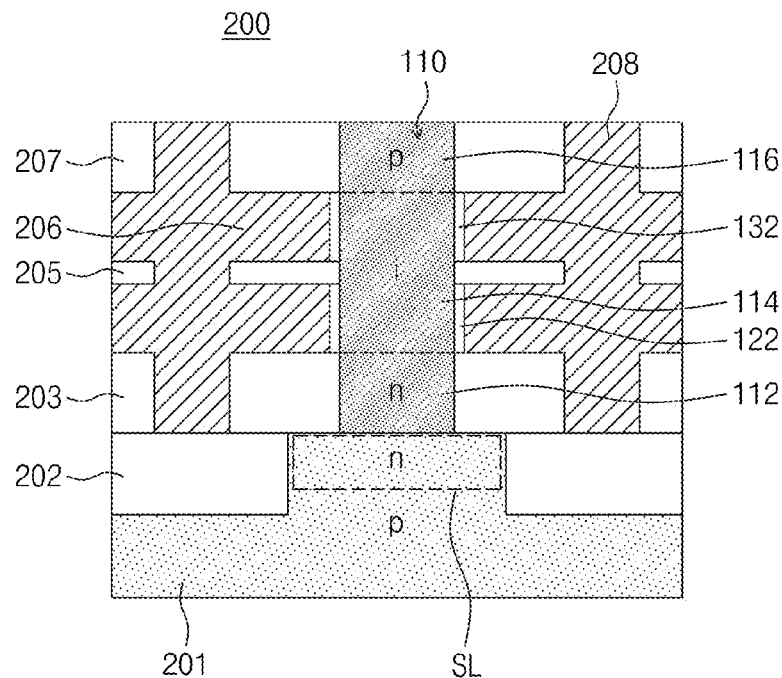

Referring to FIG. 10G, a conductor 108 fills the trench 208a and a portion where the second interlayer 204 and the fourth interlayer dielectric 206 are removed. The conductor 108 may be used as a gate electrode after being divided and may be used as a wordline to connect transistors with each other. The conductor 108 may include at least one of heavily doped polysilicon, a metal, a metal alloy, and metal silicide. A planarization process may be performed after the conductor 208 fills the trench 208a.

Figure 10H:
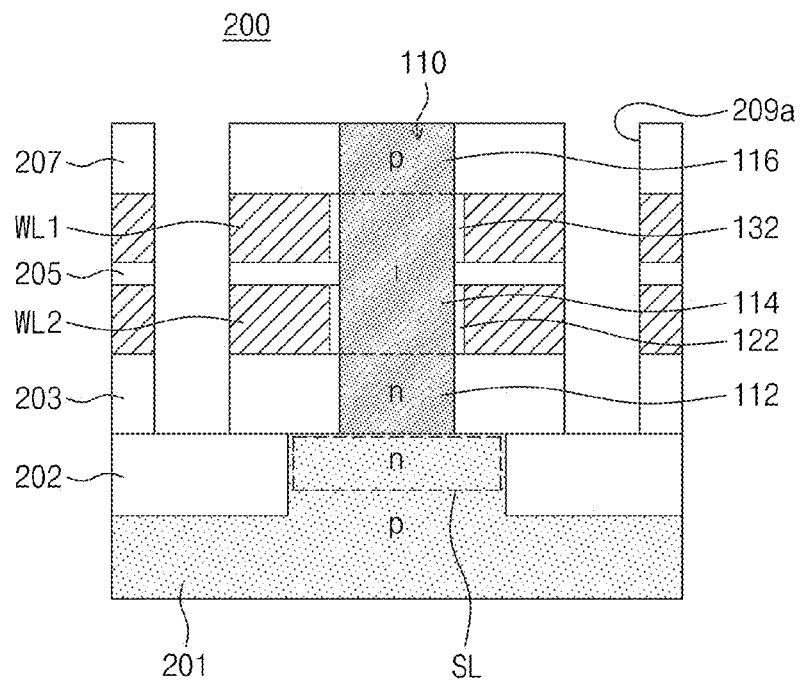

Referring to FIG. 10H, the conductor 208 filling the trench 208a is removed by a patterning process to form a first gate electrode (or first wordline) and a second gate electrode (or second wordline) and to form an auxiliary trench 209a. The auxiliary trench 209a divides the conductor 208 in the second direction to form a first wordline WL1 and a second wordline WL2.

Figure 10I:
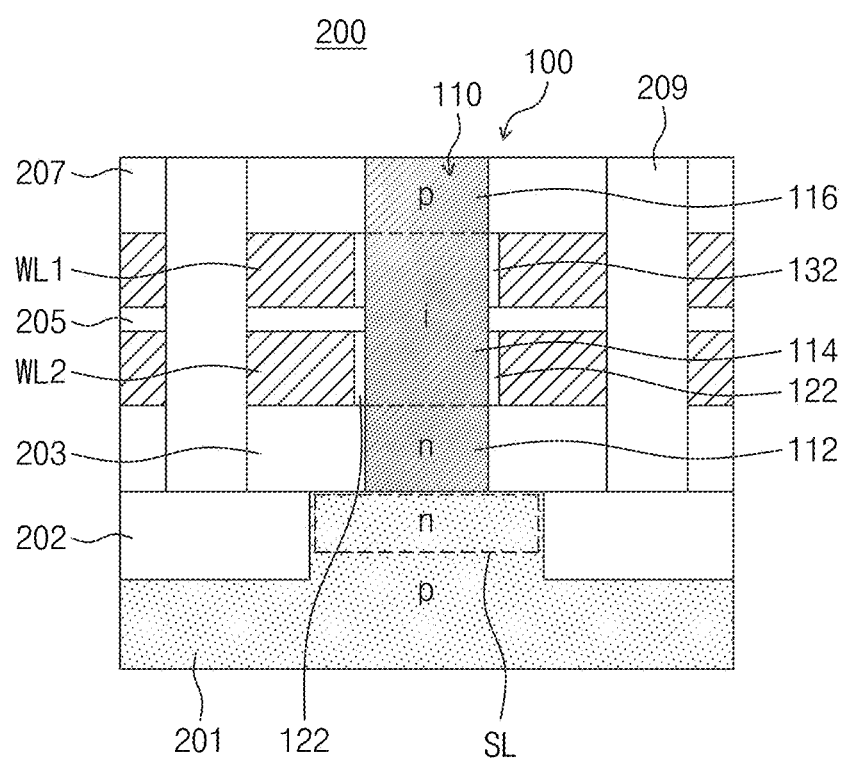

Referring to FIG. 10I, a gate isolation layer 209 may be formed by filling the auxiliary trench 209a with an insulator. A planarization process may be performed after the insulator fills the auxiliary trench 208a.

Returning to FIG. 9, a bitline BL is formed by a patterning process to be in contact with the drain region of the semiconductor column 100 and to extend in a second direction perpendicular to the first direction. The bitline BL may connect the drain regions of the semiconductor columns 100, which are arranged in the second direction, with each other. The bitline BL may include at least one of a metal, a metal alloy, and metal silicide.

Figure 11:
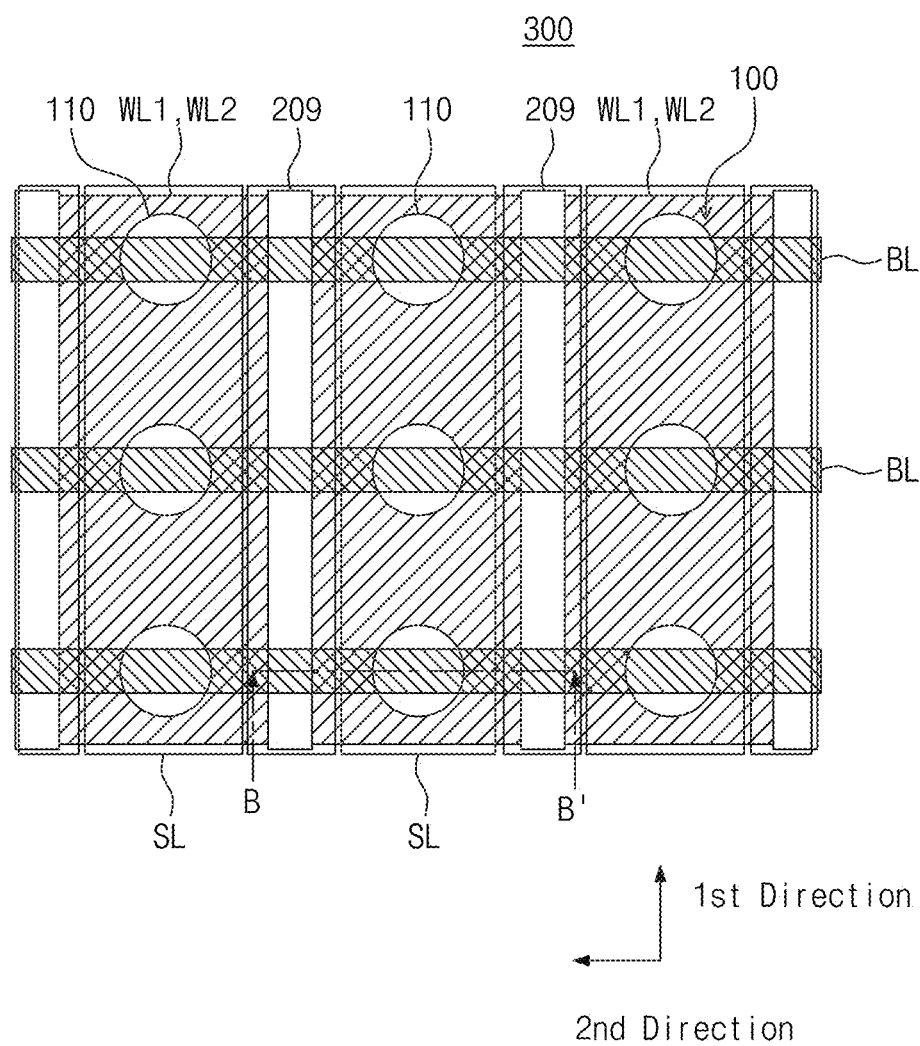
FIG. 11 is a top plan view of a memory device according to another example embodiment of the present disclosure.

FIG. 11 is a top plan view of a memory device according to another example embodiment of the present disclosure.

Figure 12:
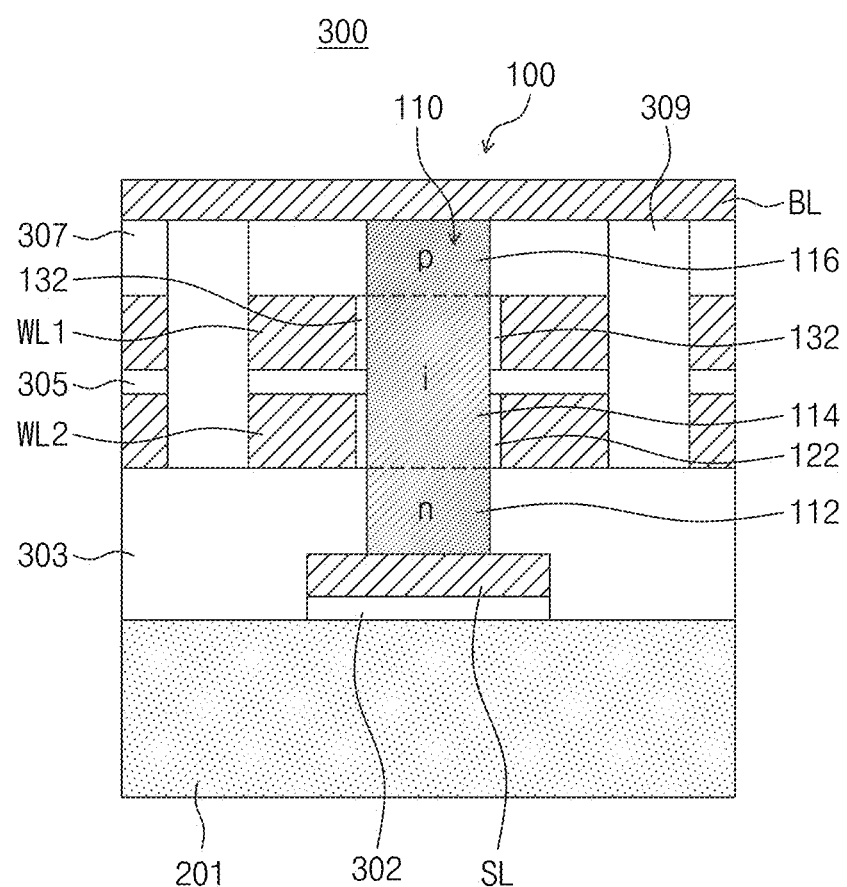
FIG. 12 is a cross-sectional view taken along the line B-B' in FIG. 11.

FIG. 12 is a cross-sectional view taken along the line B-B' in FIG. 11.

FIGS. 13A through 13H are cross-sectional views illustrating a method of fabricating the memory device in FIG. 12.

Referring to FIG. 11 through 13, a capacitorless DRAM 300 includes unit memory devices 100. The unit memory cells 100 are arranged in a matrix, and a semiconductor column 110 of the unit memory device 100 extends vertically from a substrate. The unit memory device 100 is a four-terminal device including a first gate G1, a second gate G2, a source S, and a drain. First gates of unit memory devices arranged in a first direction are connected to a first wordline WL1, and second gates thereof are connected to a second wordline WL2.

A drain of a unit memory device arranged in a second direction is connected to a bitline BL. A source S of the unit memory device arranged in the first direction is connected to a source line SL. If one of the first and second wordlines WL1 and WL2 is used to apply a gate bias voltage and the other wordline and the bitline BL are selected to apply a voltage corresponding to a write operation, a hold operation, and a read operation, each unit memory cell may be accessed.

The unit memory device 100 includes a semiconductor column 110, a first gate electrode 134, a second gate electrode 124, a first gate insulating layer 132, and a second gate insulating layer 122. The semiconductor column 110 includes a source region 112 of a first conductivity type extending vertically on a substrate, a drain region 116 of a second conductivity, and an intrinsic region 114 formed between the source region 112 and the drain region 116. The first gate electrode 134 is disposed adjacent to the drain region 116 to cover the intrinsic region 114. The second gate electrode 124 is disposed adjacent to the source region 112 to cover the intrinsic region 114. The first gate electrode 134 and the second gate electrode 134 are vertically spaced apart from each other. The first gate insulating layer 132 is disposed between the first gate electrode 134 and the intrinsic region 114, and the second gate insulating layer 122 is disposed between the second gate electrode 124 and the intrinsic region 114.

The memory device 300 includes source lines SL, semiconductor columns 110, first wordlines WL1, a second wordline WL2, a first gate insulating layer 132, a second gate insulating layer 122, gate isolation layers 309, and a bitline BL. The first gate electrode 134 may be commonly used in a plurality of transistors arranged in a first direction to constitute the first wordline WL. The second gate electrode 124 may be commonly used in a plurality of transistors arranged in the first direction to constitute the second wordline WL2.

The source lines SL extend on the substrate 201 parallel to each other in the first direction. The source line insulating layer 302 is disposed between the source lines SL and the substrate 201. The source lines SL may be doped silicon. The source line insulating layer 302 may be a silicon oxide layer. The source line SL and the source line insulating layer 302 may be vertically aligned with each other.

The semiconductor columns 110 are periodically arranged on the source lines SL and extend vertically on the substrate 201. The first wordlines WL1 is disposed to cover side surfaces of the semiconductor columns 110 arranged in the first direction and extend in the first direction. The second wordlines WL2 are disposed below the first wordlines WL1 to cover the side surfaces of the semiconductor columns 110 arranged in the first direction and extend in the first direction.

The first gate insulating layer 132 is disposed between the semiconductor column 110 and the first wordline WL1 to cover the side surface of the semiconductor column 110. The second gate insulating layer 122 is disposed between the semiconductor column 110 and the second wordline WL2 to cover the side surface of the semiconductor column 110.

The gate isolation layers 309 extend in the first direction and fill spaces between the wordlines WL1 and WL2.

The bitline BL extend in a second direction perpendicular to the first direction in contact with top surfaces of the semiconductor columns 110 arranged in the second direction. The semiconductor column 110 includes a source region of a first conductivity type, a drain region of a second conductivity type, and an intrinsic region between the source region and the drain region. The source region is in contact with the source line SL, and the drain region is in contact with the bitline BL. The first conductivity type may be n-type, and the second conductivity type may be p-type.

The substrate 201 may be a silicon substrate. The substrate 201 may be divided into a cell region where unit memory cells are formed and a peripheral circuit region where peripheral circuits are disposed.

The source lines SL is formed on the substrate 201 with the source line insulating layer 302 interposed therebetween. The source lines SL may extend in the first direction and may be silicon doped with impurities of the first conductivity type. The semiconductor columns 110 may be formed of silicon by chemical vapor deposition (CVD) or epitaxial growth. The semiconductor columns 110 may be doped to have a p-i-n structure or an n-i-p structure simultaneously with its growth. The wordlines WL1 and WL2 may include at least one of heavily doped polysilicon, a metal, a metal alloy, and metal silicide. Each of the first and the second gate insulating layers 132 and 122 may be a silicon oxide layer or a silicon oxynitride layer. The bitline BL may include at least one of a metal, a metal alloy, and metal silicide.

The capacitorless DRAM 300 may be fabricated by a fabricating method, which will now be described below.

The source line SL extending in the first direction is patterned on the substrate 201 with the source line insulating layer 302 interposed therebetween. A first interlayer dielectric 303, a second interlayer dielectric 304, a third interlayer dielectric 305, a fourth interlayer dielectric 306, and a fifth interlayer dielectric 307 are sequentially stacked on the substrate 201 where the source line SL is formed. A through-hole is formed on the source line SL through the fifth interlayer dielectric 307, the fourth interlayer dielectric 306, the third interlayer dielectric 305, the second interlayer dielectric 304, and the first interlayer dielectric 303. The semiconductor column 110 including the source region of the first conductivity type, the intrinsic region, and the drain region of the second conductivity grows in the through-hole. A trench is formed between the semiconductor columns 110 arranged in the first direction to penetrate the fifth interlayer dielectric 307, the fourth interlayer dielectric 306, the third interlayer dielectric 305, and the second interlayer dielectric 304 and to extend in the first direction. After the second interlayer dielectric 304 and the fourth interlayer dielectric 306 are removed, a first gate insulating layer 132 and a second gate insulating layer 122 are formed on exposed side surfaces of the semiconductor column 110, respectively. A conductor fills the trench and a portion where the second interlayer dielectric 304 and the fourth interlayer dielectric 306 are removed. The conductor filling the trench is removed to form a gate electrode and an auxiliary trench. The auxiliary trench is filled with an insulator. A bitline BL is formed to be in contact with the drain region of the semiconductor column 110 and to extend in a second direction perpendicular to the first direction.

Figure 13A:
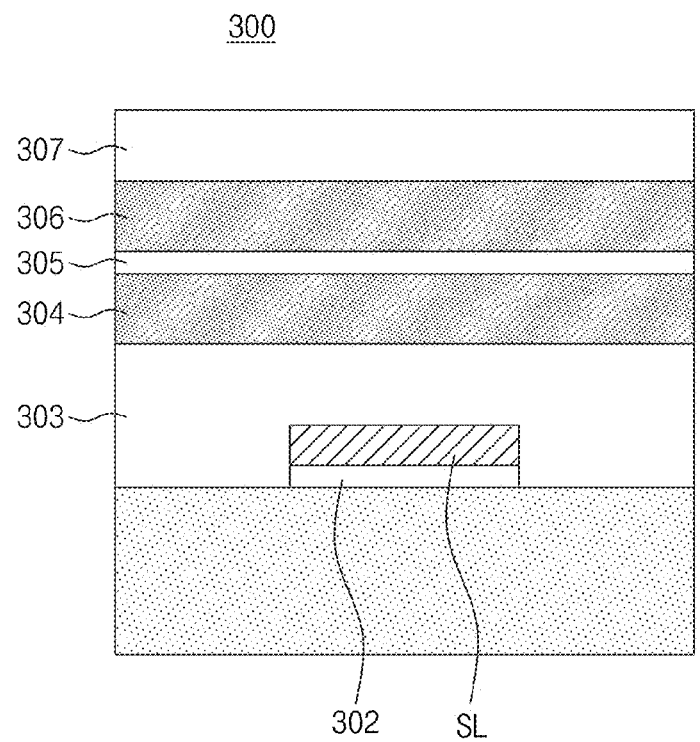
FIGS. 13A through 13H are cross-sectional views illustrating a method of fabricating the memory device in FIG. 12.

Referring to FIG. 13A, a source line insulating layer 302 and a conductive layer are formed and patterned on a substrate 201 to form a source line SL. The source line insulating layer 302 may be a silicon oxide layer or a silicon nitride layer. The conductive layer may be made of polysilicon doped with impurities of a first conductivity type or single-crystalline silicon.

In a modified embodiment of the present disclosure, the source line insulating layer 302 may not be patterned.

A first interlayer dielectric 303, a second interlayer dielectric 304, a third interlayer dielectric 305, a fourth interlayer dielectric 306, and a fifth interlayer dielectric 307 are staked on the substrate 201 where the source line SL is formed. A planarization process may be performed after the first interlayer dielectric 303 is deposited. Each of the first, third, and fifth interlayer dielectrics 303, 305, and 307 may be a silicon oxide layer. Each of the second and fourth interlayer dielectrics 304 and 306 may be a silicon nitride layer.

Figure 13B:
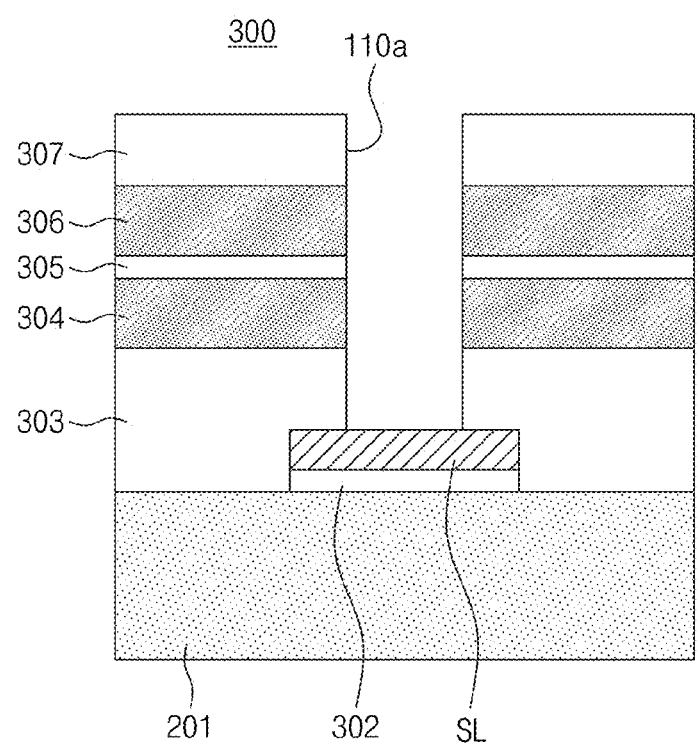

Referring to FIG. 13B, using a pattering process, a through-hole 110a is formed on the source line SL through the fifth interlayer dielectric 307, the fourth interlayer dielectric 306, the third interlayer dielectric 305, the second interlayer dielectric 304, and the first interlayer dielectric 303. The through-holes 110a may be arranged on the source line SL in a matrix.

Figure 13C:
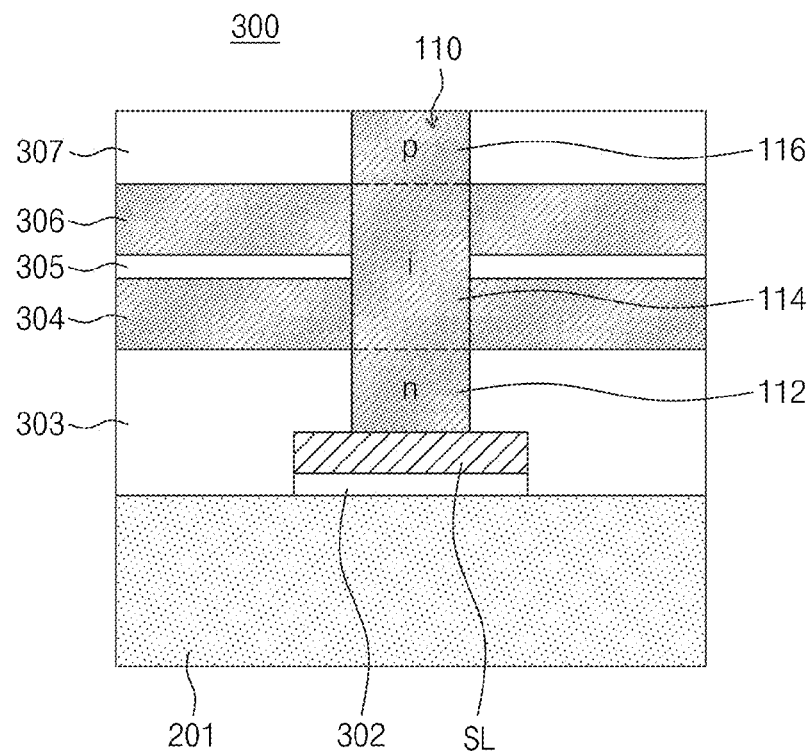

Referring to FIG. 13C, the semiconductor column 110 including the source region of the first conductivity type, the intrinsic region, and the drain region of the second conductivity type grows in the through-hole 110a. After formation of the semiconductor column 110, a planarization process may be performed.

Figure 13D:
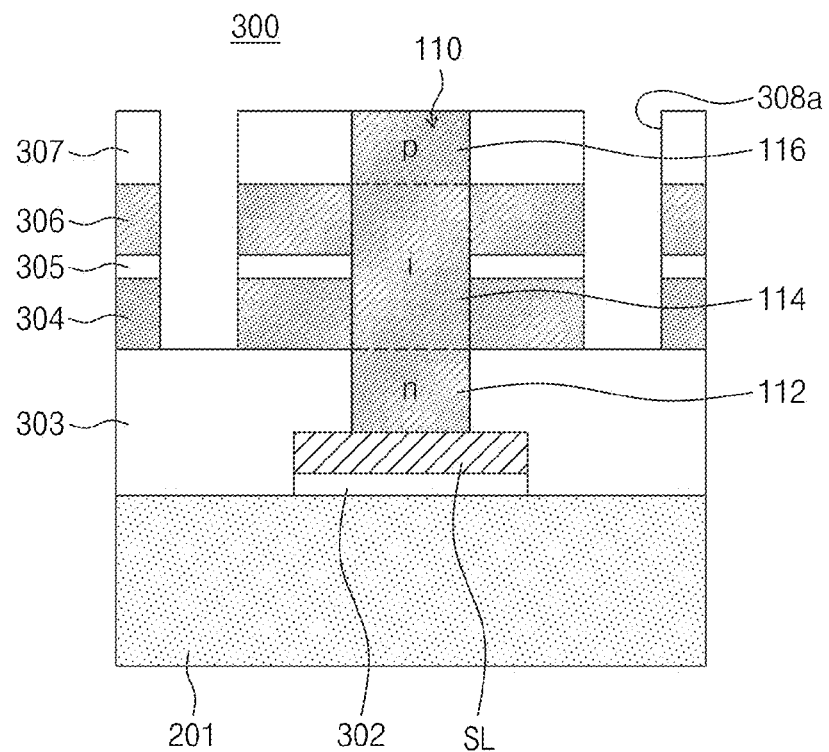

Referring to FIG. 13D, a trench 308a is formed to penetrate the fifth interlayer dielectric 307, the fourth interlayer dielectric 306, and the second interlayer dielectric 305 and to extend in the first direction between the semiconductor columns 110 arranged in the first direction. The trenches 308a may isolate the second to fifth interlayer dielectrics 305 to 307 from each other.

Figure 13E:
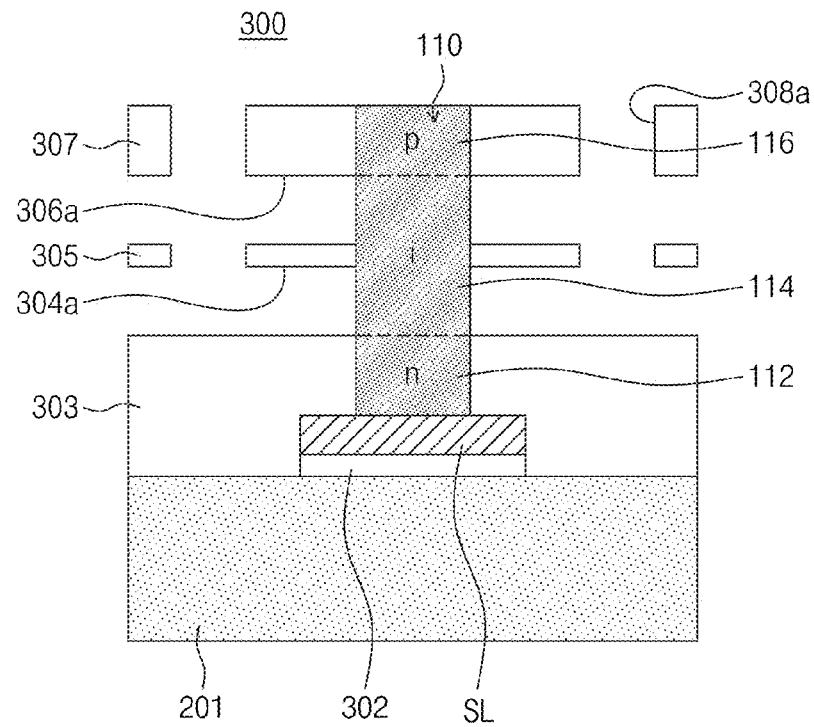
Figure 13F:
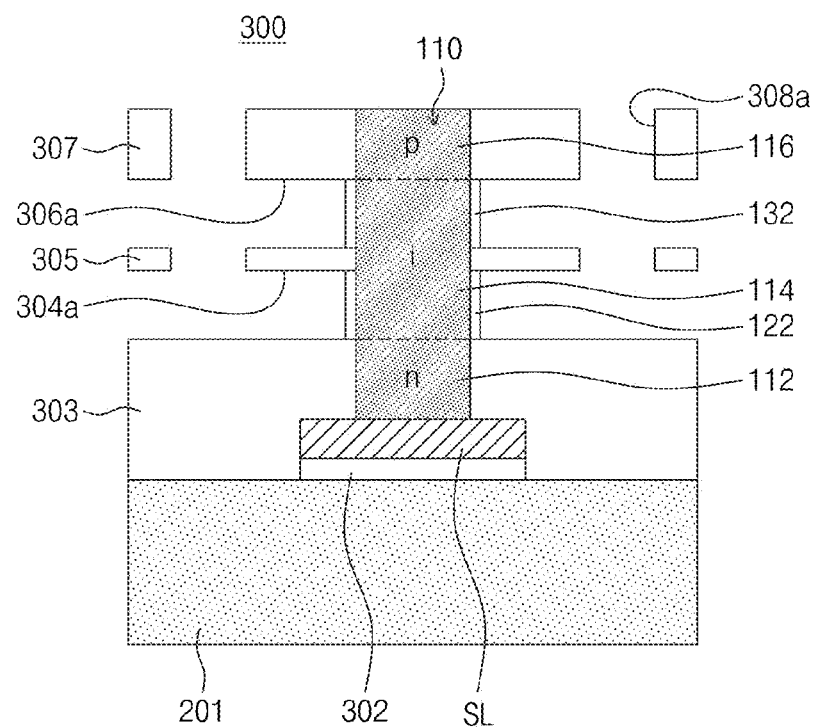

Referring to FIGS. 13E and 13F, the second interlayer dielectric 304 and the fourth interlayer dielectric 306 are selectively removed by wet etching. A first gate insulating layer 132 and a second gate insulating layer 122 are formed on the exposed side surfaces of the semiconductor columns 110, respectively.

In a modified embodiment of the present disclosure, a charge storage layer and an auxiliary gate insulating layer may be further formed after formation of the first and second gate insulating layers 132 and 122. In this case, the charge storage layer may perform a charge trapping operation.

Figure 13G:
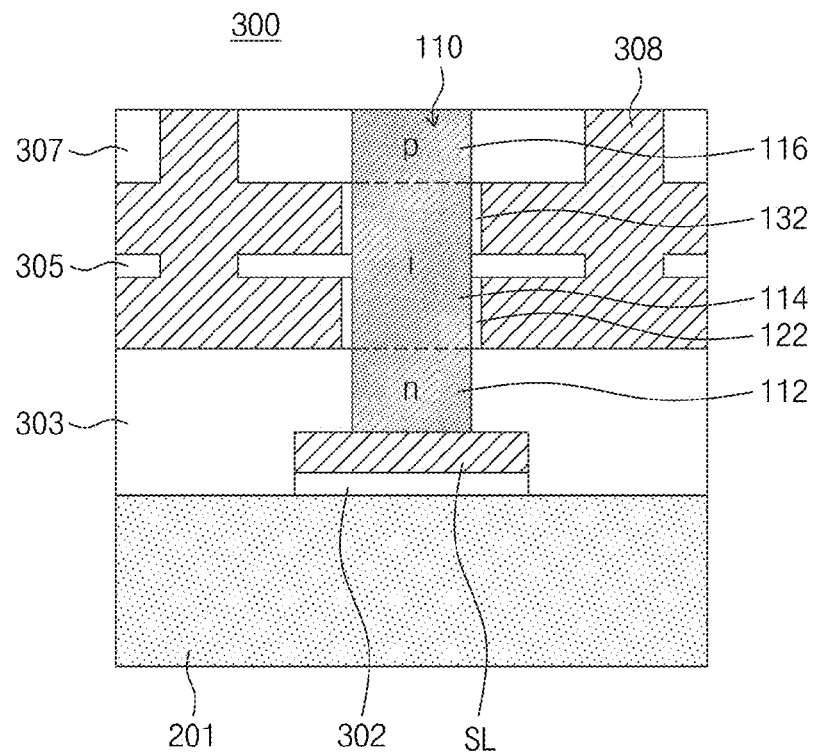

Referring to FIG. 13G, a conductor 308 fills the trench 308a and a portion where the second interlayer dielectric 304 and the fourth interlayer dielectric 306 are removed. A planarization process may be performed after the conductor 308 fills the trench 308a.

Figure 13H:
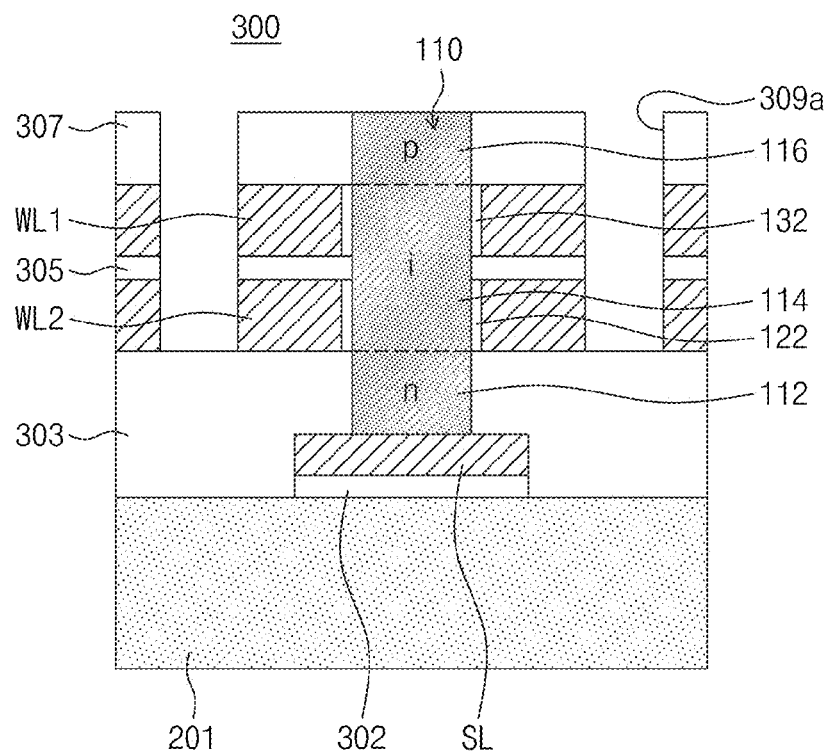

Referring to FIG. 13H, the conductor 308 filling the trench 308a is removed to form a first gate electrode (or first wordline) and a second gate electrode (or second wordline) and an auxiliary trench 309a. The auxiliary trench 309a is filled with an insulator. Thus, a gate isolation layer 309a is formed.

Returning to FIG. 12, a bitline BL is formed using a patterning process to be in contact with the drain region of the semiconductor column 110 and to extend in a second direction perpendicular to the first direction.

Figure 14:
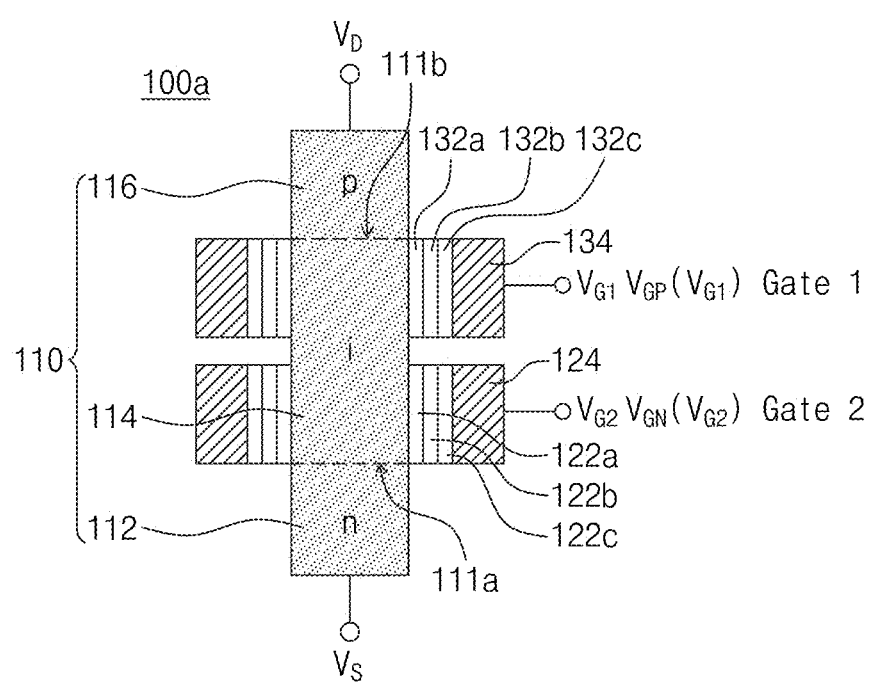
FIG. 14 is a conceptual diagram of a memory device according to another example embodiment of the present disclosure.

FIG. 14 is a conceptual diagram of a memory device according to another example embodiment of the present disclosure.

Figure 15:
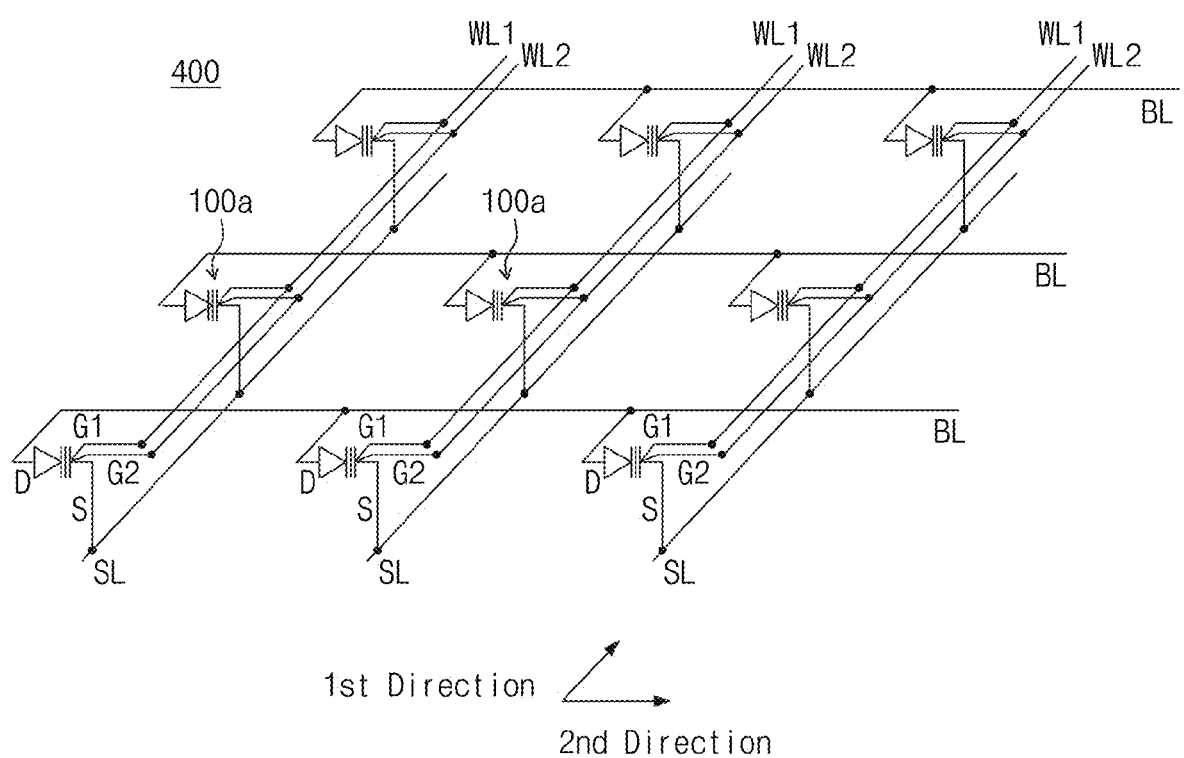
FIG. 15 is a circuit diagram of the memory device in FIG. 14.

FIG. 15 is a circuit diagram of the memory device in FIG. 14.

Figure 16:
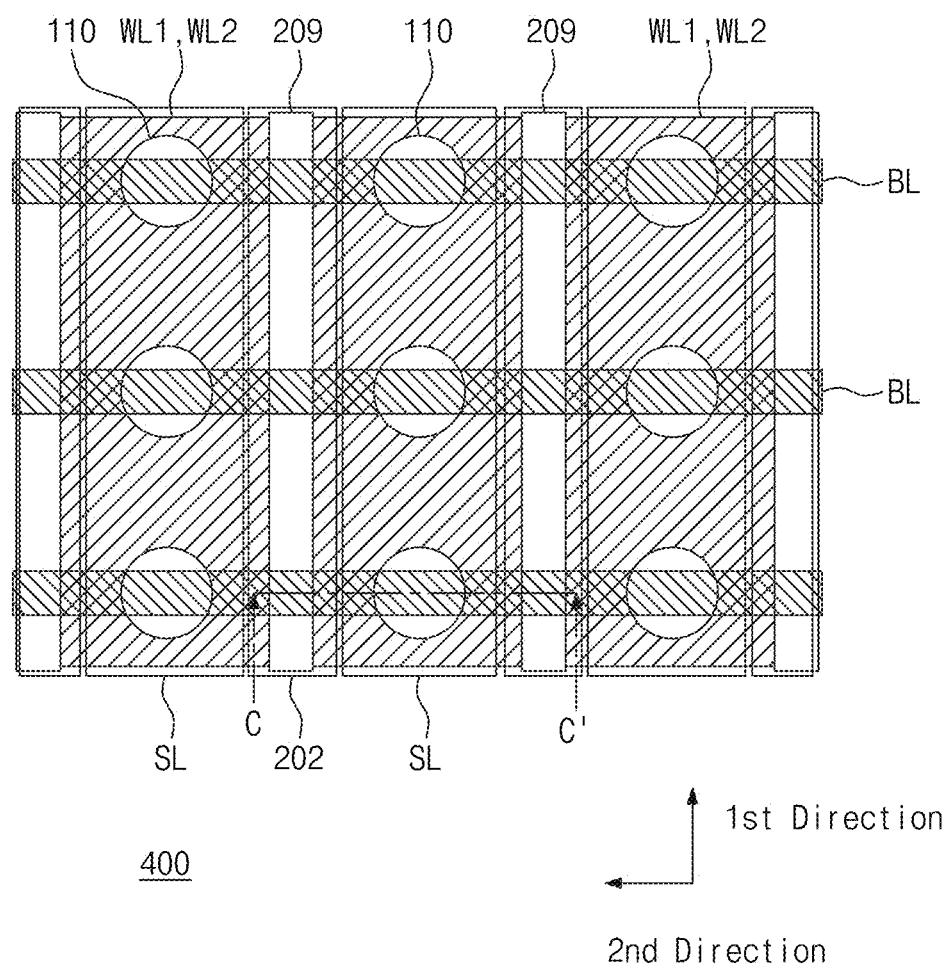
FIG. 16 is a top plan view of the memory device in FIG. 15.

FIG. 16 is a top plan view of the memory device in FIG. 15.

Figure 17:
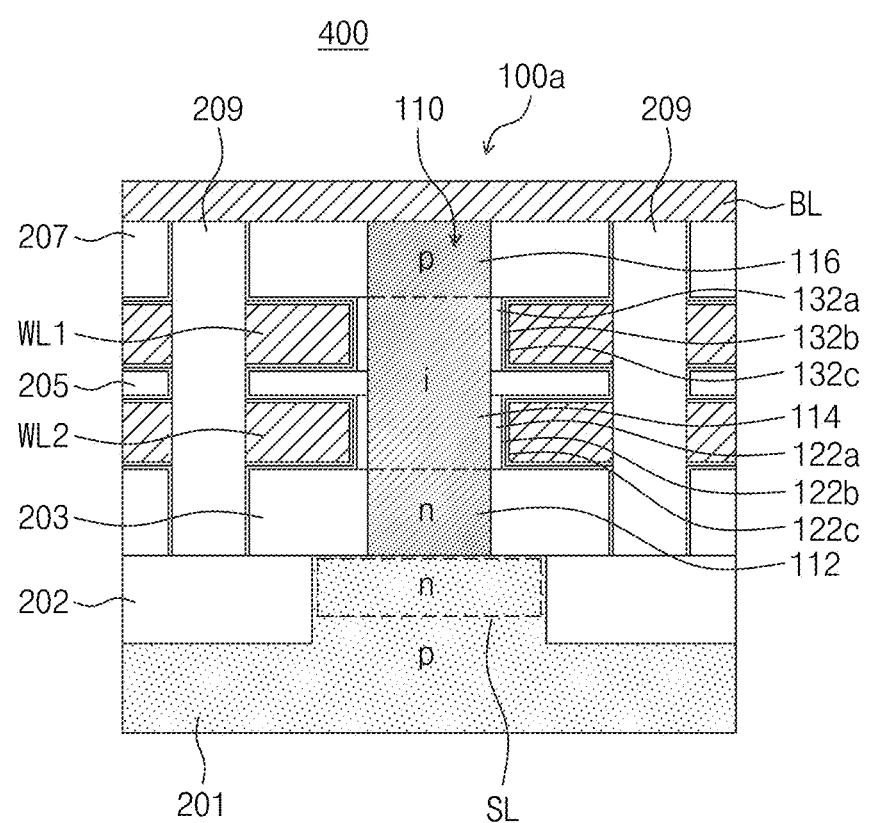
FIG. 17 is a cross-sectional view taken along the line C-C' in FIG. 16.

FIG. 17 is a cross-sectional view taken along the line C-C' in FIG. 16.

FIGS. 18A through 18H are cross-sectional views illustrating a fabricating process of the memory device in FIG. 17.

Referring to FIGS. 14 through 18, a memory device 100a includes a semiconductor column 110 including a source region of a first conductivity type extending vertically on a substrate 201, a drain region of a second conductivity type, and an intrinsic region formed between the source region and the drain region; a first gate electrode 134 disposed adjacent to the drain region to cover the intrinsic region; a second gate electrode 124 disposed adjacent to the source region to cover the intrinsic region; a first gate insulating layer 132a disposed between the first gate electrode 134 and the intrinsic region; and a second gate electrode 122a disposed between the second gate electrode 124 and the intrinsic region. The memory device 100a includes a first charge storage layer 132b disposed between the first gate insulating layer 132a and the first gate electrode 134 and a first auxiliary gate insulating layer 132c disposed between the first charge storage layer 132b and the first gate electrode 134. The memory device 100a includes a second charge storage layer 122b disposed between the second gate insulating layer 122a and the second gate electrode 124 and a second auxiliary gate insulating layer 122c disposed between the second charge storage layer 122b and the second gate electrode 124.

Each of the first and second charge storage layers 132b and 122b may be a charge trapping layer such as a silicon oxide layer. Each of the first and second auxiliary gate insulating layers 132c and 122c may be a high-k dielectric layer. For example, the first auxiliary gate insulating layer 132c may be an aluminum oxide layer, a zirconium oxide layer or a hafnium oxide layer.

A memory device 400 may operate as an EPROM. The memory device 400 may include unit memory devices 100a arranged in a memory device matrix.

The memory device 400 includes device isolation layers 202 arranged parallel to each other on a substrate in a first direction; source lines SL having the same top surface as the device isolation layer 202, disposed between the device isolation layers 202, and arranged parallel to each other in the first direction; semiconductor columns 110 periodically arranged on the source lines SL and extending vertically on the substrate; first wordlines WL1 disposed to over side surfaces of the semiconductor columns 110 arranged in the first direction and extending in the first direction; second wordlines WL2 vertically spaced apart from the first wordlines WL1, disposed to cover side surface of the semiconductor columns 110 arranged in the first direction, and extending in the first direction; a first gate insulating layer 132a disposed between the semiconductor column 110 and the first wordline WL1 to cover the side surface of the semiconductor column 110; a second gate insulating layer 122a disposed between the semiconductor column 110 and the second wordline WL2 to cover the side surface of the semiconductor column 110; gate isolation layers 209 extending in the first direction and filling spaces between the first wordlines WL1 and the second wordlines WL2; and a bitline BL extending in the second direction in contact with top surface of the semiconductor columns 110 arranged in a second direction perpendicular to the first direction. The semiconductor column 110 includes a source region of a first conductivity type, a drain region of a second conductivity type, and an intrinsic region formed between the source region and the drain region. The source region is in contact with the source line, and the drain region is in contact with the bitline BL. The first wordline WL1 may be disposed adjacent to the drain region, and the second wordline WL2 may be disposed adjacent to the source region.

A lower insulating layer is disposed between the first wordline WL1 and the substrate 201. An upper insulating layer is disposed between the first wordline WL1 and the bitline BL. A middle insulating layer is disposed between the first wordline WL1 and the second wordline WL2. A first interlayer dielectric 203 may be patterned to constitute the lower insulating layer. A third interlayer dielectric 205 may be patterned to constitute the middle insulating layer. An upper insulating layer 207 may be patterned to constitute the upper insulating layer.

The first charge storage layer 132b extends to be interposed between the upper insulating layer 207 and the first wordline WL1. The first charge storage 132b extends to be interposed between the middle insulating layer 205 and a bottom surface of the first wordline WL1.

The second charge storage layer 122b extends to be interposed between the middle insulating layer 205 and the second wordline WL2. The second charge storage layer 122b extends to be interposed between the lower insulating layer 203 and a bottom surface of the second wordline WL2.

The first auxiliary gate insulating layer 132c extends to be interposed between the upper insulating layer 207 and the first wordline WL1. The first auxiliary gate insulating layer 132c extends to be interposed between the middle insulating layer 205 and the first wordline WL1.

The second auxiliary gate insulating layer 122c extends to be interposed between the middle insulating layer 205 and the second wordline WL2. The second auxiliary gate insulating layer 122c extends to be interposed between the lower insulating layer 203 and the second wordline WL2.

According to an example embodiment of the present disclosure, the memory device 100a may operate as a nonvolatile memory when a gate structure includes the charge storage layers 132b and 122b. The memory device 100a performs a program operation and an erase operation such that the memory device 100a operates as a nonvolatile memory. At least one of the first and second charge storage layers 132b and 122b may store charges.

For example, a program operation is performed such that charges may be stored in the first charge storage layer 132b to change a threshold voltage of a transistor. More specifically, a program gate voltage of several or more volts may be applied to the first gate electrode 134 to apply a program drain voltage of about 1 volt to the drain. Thus, electronic charges of drain current may be transferred and trapped to the first charge storage layer 132b. The program gate voltage may be a positive voltage that is sufficiently greater than a threshold voltage of a MOS transistor. When a logic state '1' is written by a program operation, the threshold voltage of the transistor increases. During a read operation after the program operation, a gate voltage is about 0 volt and a drain voltage is about 1 volt.

An erase operation may be performed to remove the electronic charges stored in the first charge storage layer 132b. More specifically, when an erase gate voltage of negative several or more volts is applied to the first gate electrode 134, the charges stored in the first charge storage layer 132b may be released to a channel. The erase gate voltage may be a negative voltage that is sufficiently greater than the threshold voltage of the MOS transistor.

All memory devices connected to the selected first wordline WL1 are erased during an erase operation. Meanwhile, among all the memory devices connected to the selected first wordline WL1, only a memory device applied with a drain voltage by the bitline BL may be selectively programmed during a program operation. After the erase operation, a gate voltage may be about 0 volt and a drain voltage may be about 1 volt.

A determination is made as to whether or not to store the electronic charges in the first charge storage layer 132b or the second charge storage layer 122b. When the charges are stored in the first charge storage layer 132b, a semiconductor memory device operates as an EPROM. Meanwhile, when the charges are not stored in the first charge storage layer 132, the semiconductor memory device operates as a capacitorless DRAM.

When the memory device 110a operates as a capacitorless DRAM of an n channel operation mode, the first gate electrode 134 is always maintained at a gate bias voltage. In order for the memory device 110a to have a first logic state, a first gate voltage is applied to the second gate electrode 124 and a first drain voltage is applied to the drain region to write the first logic state. Then in order to maintain the first logic state, a second gate voltage is applied to the second gate electrode 124 and a second drain voltage is applied to the drain region. Then in order to read the first logic state, the second gate voltage is applied to the second gate electrode 124 and the first drain voltage is applied to the drain region.

When the memory device 110a operates as a capacitorless DRAM of an n channel operation mode, the first gate electrode is always maintained at a gate bias voltage. In order for the memory device 110a to have a second logic state, a third gate voltage is applied to the second gate electrode 124 and the first drain voltage is applied to the drain region to write the second logic state. Then in order to maintain the second logic state, the second gate voltage is applied to the second gate electrode 124 and the second drain voltage is applied to the drain region. Then in order to read the second logic state, the second gate voltage is applied to the second gate electrode 124 and the first drain voltage is applied to the drain region. Due to the gate bias voltage of the first gate electrode 134, a p-i-n structure changes into a p-n-p-n structure. The first gate voltage may be between −0.25 volt and −1 volt, the second gate voltage may be between −0.1 volt and 0.1 volt, and the third gate voltage may be between 0.25 volt and 1 volt. The first drain voltage may be between 0.1 volt and 1 volt, and the second drain voltage may be 0 volt.

The memory device 400 may be fabricated by a fabricating method, which will now be described. A device isolation layer 202 extending in the first direction is formed on the substrate 201 to define an active region. A first interlayer dielectric 203, a second interlayer dielectric 204, a third interlayer dielectric 205, a fourth interlayer dielectric 206, and a fifth interlayer dielectric 207 are sequentially stacked on the substrate 201 where the active region is formed. A through-hole 110*a* is formed through the fifth interlayer dielectric 207, the fourth interlayer dielectric 206, the third interlayer 205, the second interlayer dielectric 204, and the first interlayer dielectric 203. The semiconductor column 110 including the source region of the first conductivity, the intrinsic region, and the drain region of the second conductivity type grows in the through-hole 110*a*. A trench 208*a* is formed to penetrate the fifth interlayer dielectric 207, the fourth interlayer dielectric 206, the third interlayer dielectric 205, the second interlayer dielectric 204, and the first interlayer dielectric 203 between the semiconductor columns 110 arranged in the first direction and to extend in the first direction. After the second interlayer dielectric 204 and the fourth interlayer dielectric 206 are removed, a second gate insulating layer and a first gate insulating layer are formed on exposed side surfaces of the semiconductor column 110, respectively. After the first gate insulating layer and the second gate insulating layer are formed, a first charge storage layer and a second charge storage layer are formed in a portion where the fourth interlayer dielectric 206 and the second interlayer dielectric 204 are removed and the trench 208*a*, respectively. After the first charge storage layer and the second charge storage layer are formed, a first auxiliary gate insulating layer and a second auxiliary gate insulating layer are formed in a portion where the fourth interlayer dielectric 206 and the second interlayer dielectric 204 are removed and the trench 208*a*, respectively. A conductor fills the trench 208*a* and the portion where the second interlayer dielectric 204 and the fourth interlayer dielectric 206 are removed. The conductor filling the trench 208*a* is removed to form a first gate electrode and a second gate electrode and to form an auxiliary trench 209*a*. The auxiliary trench 209*a* is filled with an insulator to form a gate isolation layer 209. A bitline BL is formed to be in contact with the drain region of the semiconductor column 110 and to extend in a second direction perpendicular to the first direction.

Figure 18A:
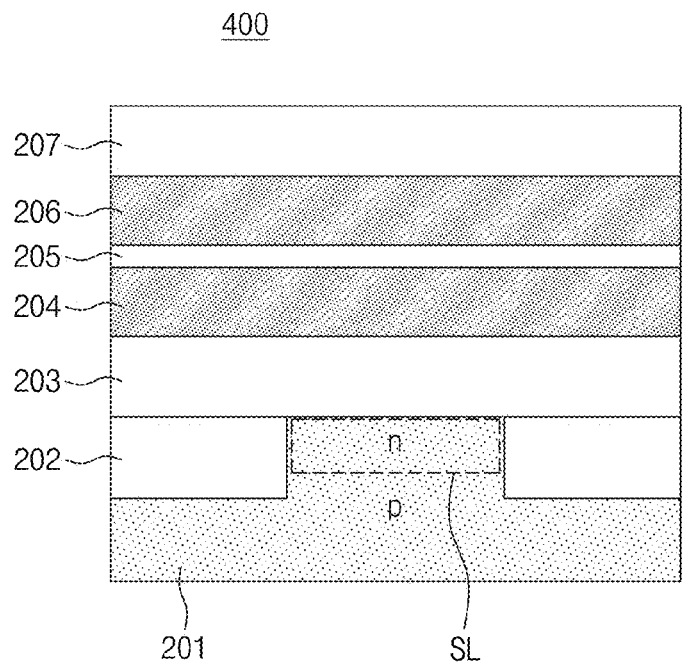
FIGS. 18A through 18H are cross-sectional views illustrating a fabricating process of the memory device in FIG. 17.

Referring to FIG. 18A, a device isolation layer 202 extending in a first direction is formed on a substrate 201 to define an active region. A cell region and a peripheral circuit region are distinguished using a mask on the substrate 201. Wells are formed in the cell region and the peripheral circuit region by ion implantation, respectively.

In the cell region, a device isolation layer 202 is formed on the substrate 201 to extend in the first direction. The device isolation layer 202 and the active region may be formed by a conventional STI process. The active region may be heavily doped to an exposed region between adjacent device isolation layers 202 by ion implantation using impurities of a first conductivity type. Thus, the active region may form the source line SL. The device isolation layer 202 may be a silicon oxide layer and include a silicon oxide layer on its top surface as an etch-stop layer.

A first interlayer dielectric 203, a second interlayer dielectric 204, a third interlayer dielectric 205, a fourth interlayer dielectric 206, and a fifth interlayer dielectric 207 are sequentially stacked on the substrate 201 where the source line SL is formed. Each of the first, third, and fifth interlayer dielectrics 203, 205, and 207 may be a silicon oxide layer, and each of the second and fourth interlayer dielectrics 204 and 206 may be a silicon oxide layer. Thickness of the third interlayer dielectric 205 may be smaller than that of the second interlayer dielectric 204 or the fourth interlayer dielectric 206.

Figure 18B:
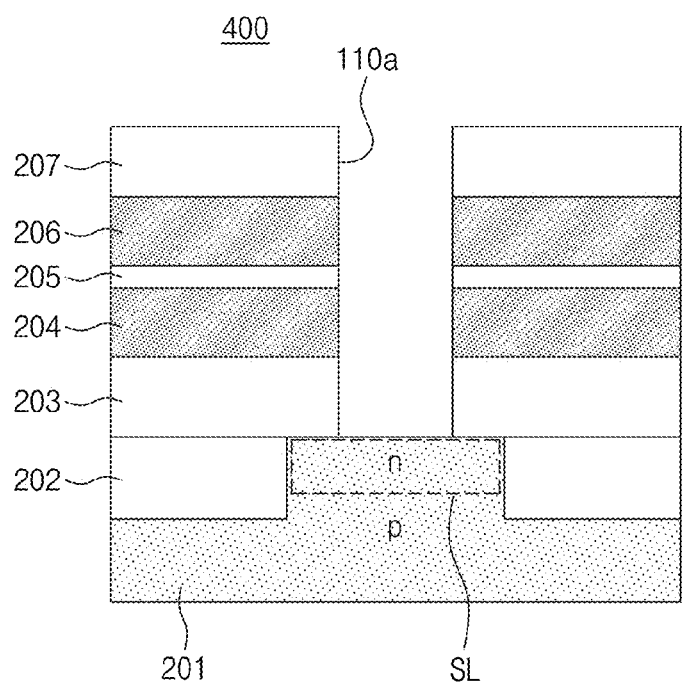

Referring to FIG. 18B, a through-hole 110*a* is formed by a patterning process to penetrate the first interlayer dielectric 203, the second interlayer dielectric 204, the third interlayer dielectric 205, the fourth interlayer dielectric 206, and the fifth interlayer dielectric 207. The trough-holes 110*a* may be periodically disposed on the source line SL in a matrix.

Figure 18C:
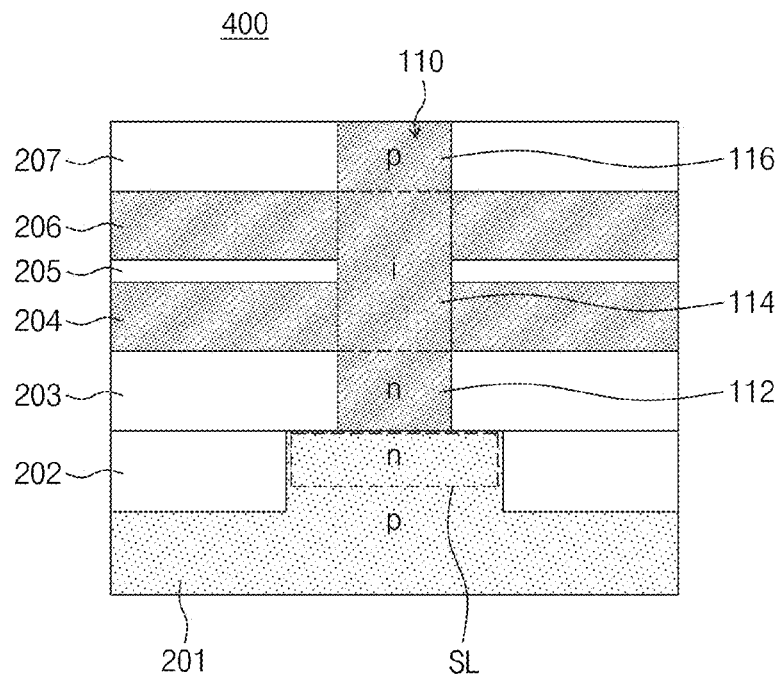

Referring to FIG. 18C, a semiconductor column 110 including a source region of a first conductivity type, an intrinsic region, and a drain region of a second conductivity type grows in the through-hole 110*a*. The intrinsic region may be aligned with the second to fourth interlayer dielectrics 204, 205, and 206. The semiconductor column 110 may be formed by a silicon epitaxial process or may be crystallized by depositing polysilicon and performing an annealing process. Doping may be performed during the silicon epitaxial process or may be performed by ion implantation after formation of a silicon column. A planarization process may be performed after the semiconductor column 110 fills the through-hole 110*a*.

Figure 18D:
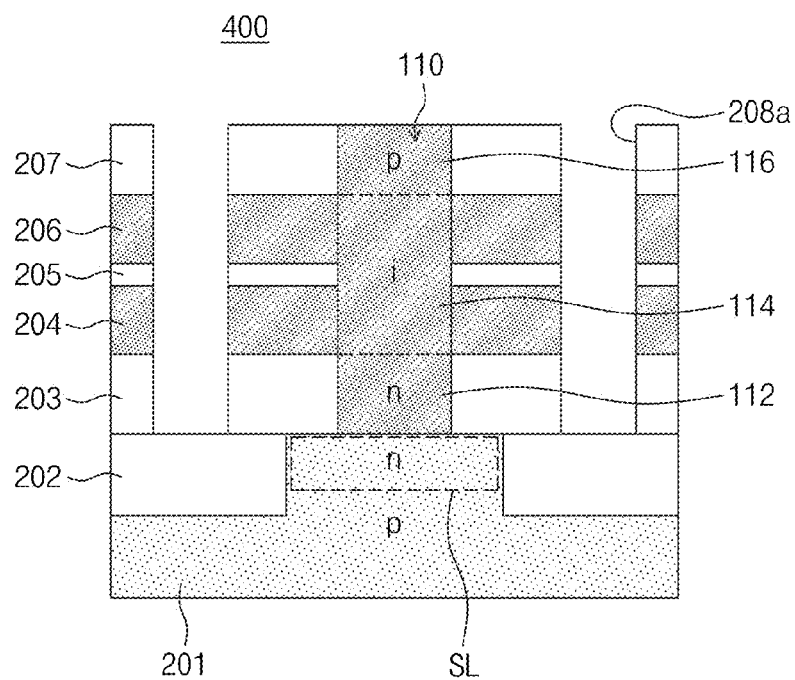

Referring to FIG. 18D, a trench 208*a* is formed to penetrate the fifth interlayer dielectric 207, the fourth interlayer dielectric 206, the third interlayer dielectric 205, the second interlayer dielectric 204, and the first interlayer dielectric 203 between the semiconductor columns 110 arranged in the first direction. The trench 208*a* may extend in the first direction to isolate the first to fifth interlayer dielectrics 203 to 207 from each other. The isolated first interlayer dielectric 203 provides a lower insulating layer, the isolated third interlayer dielectric 205 may provide a middle insulating layer, and the isolated fifth interlayer dielectric 207 may provide an upper insulating layer.

Figure 18E:
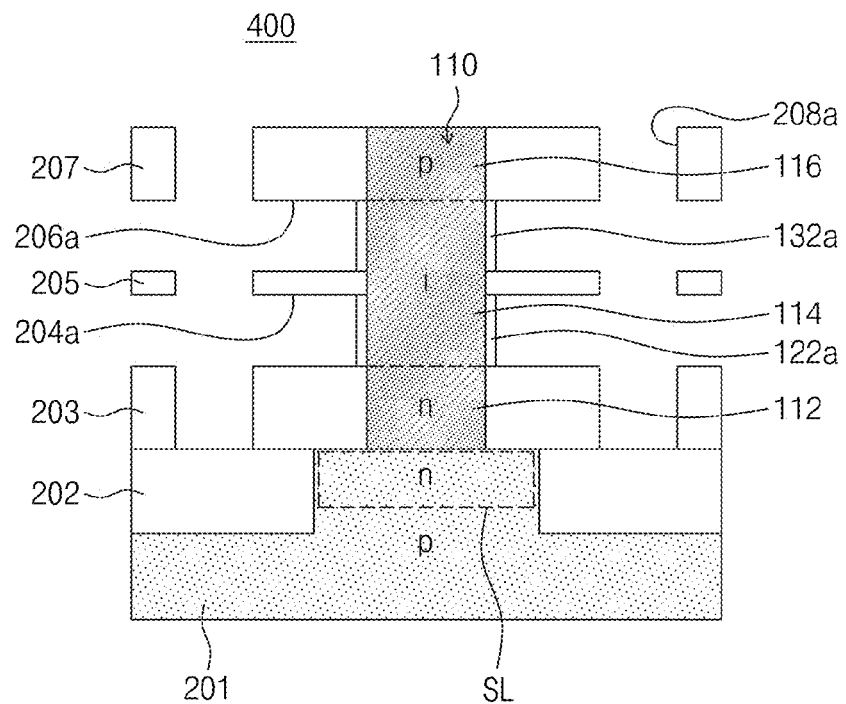

Referring to FIG. 18E, the second interlayer dielectric 204 and the fourth interlayer dielectric 206 may be selectively removed by wet etching. After the fourth interlayer dielectric 206 and the second interlayer dielectric 204 are removed, a first gate insulating layer 132*a* and a second gate insulating layer 122*a* are formed on exposed side surfaces of the semiconductor column 110, respectively. Each of the first and second gate insulating layers 132*a* and 122*a* may be a silicon oxide layer of about tens of nanometers (nm). The silicon oxide layer may be formed by a thermal oxidation process. After the first and second gate insulating layers 132*a* and 122*a* are formed, first and second charge storage layers 132*b* and 122*b* and first and second auxiliary gate insulating layers 132*c* and 122*c* may be sequentially formed. Each of the first and second charge storage layers 132*b* and 122*b* may be a thin film which is capable of trap charges and may be a silicon nitride layer. Each of the first and second auxiliary gate insulating layers 132*a* and 122*a* may be formed of a high-k dielectric material, e.g., aluminum oxide.

Figure 18F:
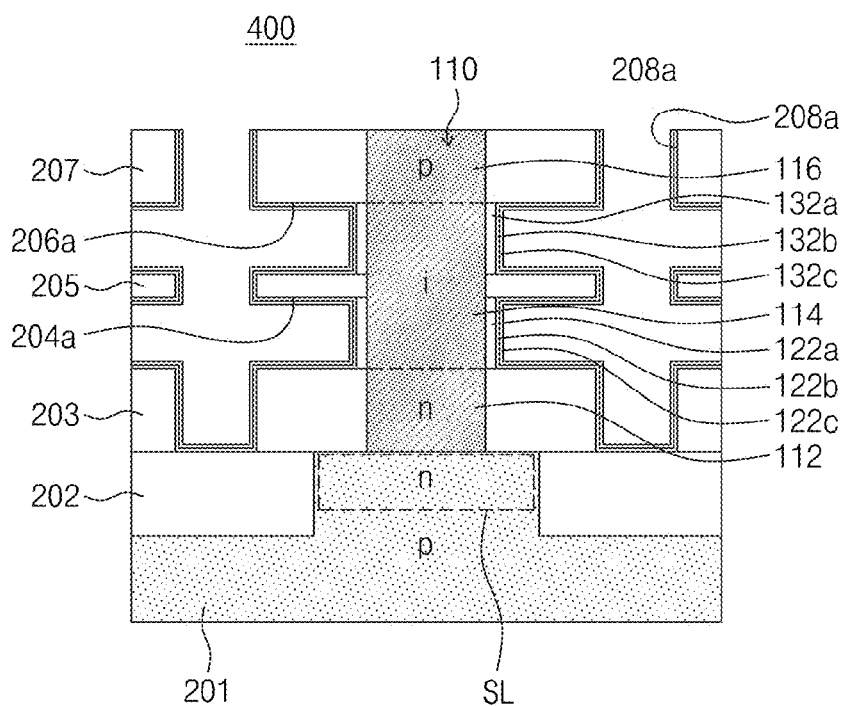

Referring to FIG. 18F, after the first and second gate insulating layers 132*a* and 122*a* are formed, a first charge storage layer 132*b* and a second charge storage layer 122*b* are formed at a portion where the fourth and second interlayer dielectrics 206 and 204 are removed and the trench 208*a*. Each of the first and second charge storage layers 132*b* and 122*b* may be a silicon nitride layer.

After the first and second charge storage layers 132b and 122b are formed, a first auxiliary gate insulating layer 132c and a second auxiliary gate insulating layer 122c are formed at a portion where the fourth and second interlayer dielectrics 206 and 204 are removed and the trench 208a, respectively. Each of the first and second auxiliary gate insulating layers 132c and 122c may be formed of a high-k dielectric material, e.g., aluminum oxide, zirconium oxide or hafnium oxide.

Figure 18G:
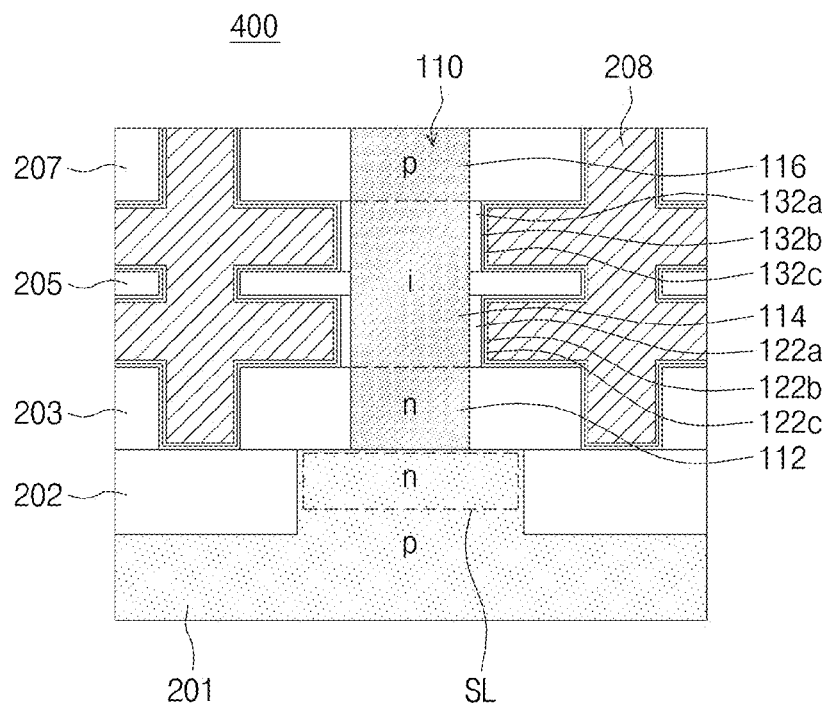

Referring to FIG. 18G, after the first and second auxiliary gate insulating layers 132c and 122c are formed, a conductor 208 fills the trench 208a and the portion where the second and fourth interlayer dielectrics 204 and 206 are removed. The conductor 208 may be used as a first gate electrode (or first wordline) and a second gate electrode (or second wordline) and as a wordline connecting transistors to each other after being isolated. The conductor 208 may include at least one of heavily doped polysilicon, a metal, a metal alloy, and metal silicide. After the conductor 208 fills the trench 208a, a planarization process may be performed.

Figure 18H:
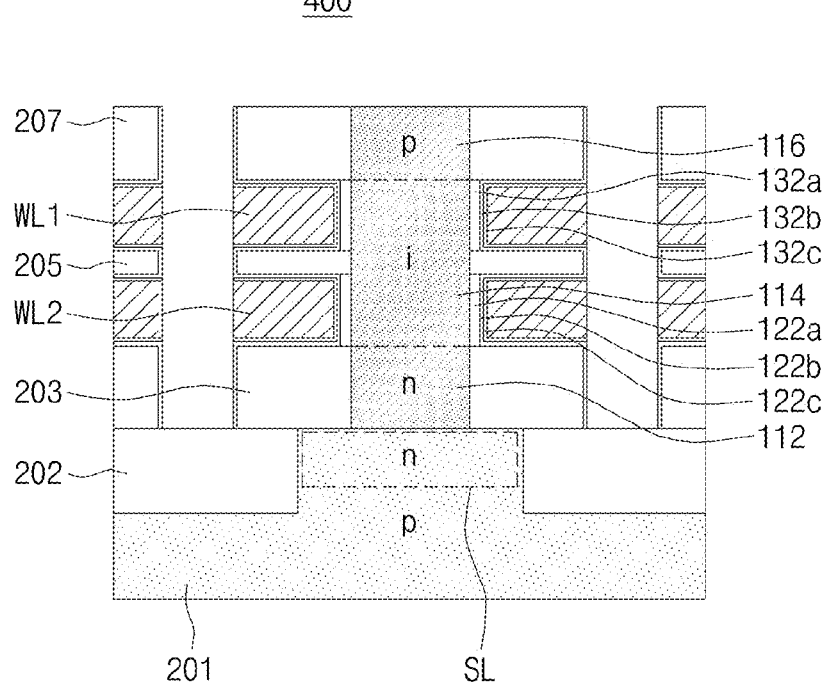

Referring to FIG. 18H, the conductor 208 filling the trench 208a is removed by a patterning process to form an auxiliary trench 209a. The auxiliary trench 209a isolates the conductor 208 in the second direction to form a first wordline WL1 and a second wordline WL2.

Returning to FIG. 17, the auxiliary trench 209a may be filled with an insulator to form a gate isolation layer 209. The gate isolation layer 209 may be disposed between the first and second wordlines WL1 and WL2 to isolate the first and second wordlines WL1 and WL2 from each other. After the insulator fills the auxiliary trench 209a, a planarization process may be performed.

Then a bitline BL is formed to be in contact with the drain region of the semiconductor column 110 and to extend in a second direction perpendicular to the first direction. The bitline BL may connect the drain regions of the semiconductor column 110 to each other. The bitline BL may include at least one of a metal, a metal alloy, and metal silicide.

In a modified embodiment of the present disclosure, a source line is not formed on an active region and may be formed by forming and patterning a separate conductive layer on a substrate.

According to example embodiments of the present disclosure, there are provided a semiconductor memory device that may be scaled down and integrated with a simple structure, reduce leakage current to have features of low power and high efficiency, and include a novel vertical semiconductor column structure where a sufficient current sensing margin or a read sensing margin may be secured even in a narrow memory window, and a selective volatile/nonvolatile mode operating semiconductor memory device using the same.

Specifically, a semiconductor memory device including a novel nanostructure and a selective volatile/nonvolatile mode operating semiconductor device using the same may require a low applied voltage during write/erase operations, have a high on-off current ratio and a low subthreshold swing (SS) to secure a sufficient current sensing margin even in a narrow memory window, have operation voltage characteristics required per low unit cell structure, and implement volatile/nonvolatile operation characteristics in a single device.

Although the present disclosure and its advantages have been described in detail, it should be understood that various changes, substitutions and alterations can be made herein without departing from the spirit and scope of the disclosure as defined by the following claims.

What is claimed is:

1. A memory device comprising:
a semiconductor column extending vertically on a substrate and including a source region of a first conductivity type, an intrinsic region, and a drain region of a second conductivity type;
a first gate electrode disposed adjacent to the drain region to cover the intrinsic region;
a second gate electrode spaced apart from the first gate electrode and disposed adjacent to the source region to cover the intrinsic region;
a first gate insulating layer disposed between the first gate electrode and the intrinsic region; and
a second gate insulating layer disposed between the second gate electrode and the intrinsic region,
the memory device further comprising:
a source insulating layer disposed between a top surface of the substrate and a bottom surface of the semiconductor column; and
a source line disposed between the source insulating layer and the bottom surface of the semiconductor column,
wherein the source line is a semiconductor doped with impurities of the first conductivity type.

2. The memory device as set forth in claim 1, wherein the first conductivity type is n-type and the second conductivity type is p-type.

3. The memory device as set forth in claim 1, wherein the substrate includes an active region and a device isolation layer,
the source region of the first conductivity type is disposed in contact with the active region, and
the active region is doped with impurities of the first conductivity type.

4. The memory device as set forth in claim 1, further comprising:
a bitline disposed on the drain region of the semiconductor column,
wherein the first gate electrode and the second gate electrode extend on a disposition surface in a first direction, and
the bitline extends on a disposition surface of the substrate in a second direction perpendicular to the first direction.

5. The memory device as set forth in claim 1, further comprising:
a first charge storage layer disposed between the first gate insulating layer and the first gate electrode;
a first auxiliary gate insulating layer disposed between the first charge storage layer and the first gate electrode;
a second charge storage layer disposed between the second gate insulating layer and the second gate electrode; and
a second auxiliary gate insulating layer disposed between the second charge storage layer and the second gate electrode.

6. A memory device comprising:
device isolation layers extending on a substrate parallel to each other in a first direction;
source lines each having a same top surface as the device isolation layer, disposed between the device isolation layers, and extending parallel to each other in the first direction;
semiconductor columns disposed periodically on the source lines and extending vertically on the substrate;
first wordlines disposed to cover side surfaces of the semiconductor columns arranged in the first direction and extending in the first direction;

second wordlines spaced vertically apart from the first wordlines, disposed to cover the side surfaces of the semiconductor columns arranged in the first direction, and extending in the first direction;

a first gate insulating layer disposed between the semiconductor column and the first wordline to cover a side surface of the semiconductor column;

a second gate insulating layer disposed between the semiconductor column and the second wordline to cover a side surface of the semiconductor column;

gate isolation layers extending in the first direction and filling spaces between the first wordlines and the second wordlines; and a bitline extending in the second direction in contact with top surface of the semiconductor columns arranged in a second direction perpendicular to the first direction, wherein the semiconductor column includes a source region of a first conductivity type, a drain region of a second conductivity type, and an intrinsic region formed between the source region and the drain region, the source region is in contact with the source line, and the drain region is in contact with the bitline.

7. The memory device as set forth in claim 6, further comprising:

a first charge storage layer disposed between the first wordline and the first gate insulating layer;

a first auxiliary gate insulating layer disposed between the first charge storage layer and the first wordline;

a second charge storage layer disposed between the second wordline and the second gate insulating layer; and a second auxiliary gate insulating layer disposed between the second charge storage layer and the second wordline.

8. The memory device as set forth in claim 7, further comprising:

a lower insulating layer disposed between the second wordline and the substrate;

an upper insulating layer disposed between the first wordline and the bitline; and a middle insulating layer disposed between the first wordline and the second wordline, wherein the first charge storage layer extends to be interposed between the middle insulating layer and the first wordline, the first auxiliary gate insulating layer extends to be interposed between the upper insulating layer and the first wordline, the first auxiliary gate insulating layer extends to be interposed between the middle insulating layer and the first wordline, the second charge storage layer extends to be interposed between the middle insulating layer and the second wordline, the second charge storage layer extends to be interposed between the lower insulating layer and the second wordline, the second auxiliary gate insulating layer extends to be interposed between the middle insulating layer and the second wordline, and the second auxiliary gate insulating layer extends to be interposed between the lower insulating layer and the second wordline.

9. A memory device comprising:

source lines extending on a substrate parallel to each other in a first direction;

a source line insulating layer disposed between the source lines and the substrate;

semiconductor columns disposed periodically on the source lines and extending vertically on the substrate;

first wordlines disposed to cover surfaces of the semiconductor columns arranged in the first direction and extending in the first direction;

second wordlines spaced vertically apart from the first wordlines, disposed to cover side surfaces of the semiconductor columns arranged in the first direction, and extending in the first direction;

a first gate insulating layer disposed between the semiconductor column and the first wordline to cover a side surface of the semiconductor column;

gate isolation layers extending in the first direction and filling spaces between the first wordlines and the second wordlines; and a bitline being in contact with top surfaces of the semiconductor columns arranged in a second direction perpendicular to the first direction and extending in the second direction, wherein the semiconductor column includes a source region of a first conductivity type, a drain region of a second conductivity type, and an intrinsic region disposed between the source region and the drain region, the source region is in contact with the source line, and the drain region is in contact with the bitline.

10. The memory device as set forth in claim 9, further comprising:

a first charge storage layer disposed between the first wordline and the first gate insulating layer;

a first auxiliary gate insulating layer disposed between the first charge storage layer and the first wordline;

a second charge storage layer disposed between the second wordline and the second gate insulating layer; and a second auxiliary gate insulating layer disposed between the second charge storage layer and the second wordline.

11. An operating method of a memory device including a semiconductor column extending vertically on a substrate and including a source region of a first conductivity type, an intrinsic region, and a drain region of a second conductivity type; a first gate electrode disposed adjacent to the drain region to cover the intrinsic region; a second gate electrode spaced apart from the first gate electrode and disposed adjacent to the source region to cover the intrinsic region; a first gate electrode disposed between the first gate electrode and the intrinsic region; and a second gate insulating layer disposed between the second gate electrode and the intrinsic region, the operating method comprising:

applying a gate bias voltage to the first gate electrode;

applying a first gate voltage to the second gate electrode and applying a first drain voltage to the drain region to write a first logic state such that the first memory device indicates the first logic state while the gate bias voltage is applied;

applying a second gate voltage to the second gate electrode and applying a second drain voltage to the drain region such that the first logic state is maintained while the gate bias voltage is applied;

applying the second gate voltage to the second gate electrode and applying the first drain voltage to the drain region such that the first logic state is read while the gate bias voltage is applied;

applying a third gate voltage to the second gate electrode and applying the first drain voltage to the drain region to write a second logic state such that the memory device indicates the second logic state while the gate bias voltage is applied;

applying the second gate voltage to the second gate electrode and applying the second drain voltage to the drain region such that the second logic state is maintained while the gate bias voltage is applied; and applying the second gate voltage to the second gate electrode and applying the first drain voltage to the drain region such that the second logic state is read while the gate bias voltage is applied.

12. The operating method as set forth in claim 11, wherein the first conductive layer is n-type, the second conductivity type is p-type,
the gate bias voltage is between 1 volt and 3 volts,
the first gate voltage is between −0.25 volt and −1 volt,
the second gate voltage is between −0.1 volt and 0.1 volt, and
the third gate voltage is between 0.25 volt and 1 volt.

13. An operating method of a memory device including a semiconductor column extending vertically on a substrate and including a source region of a first conductivity type, an intrinsic region, and a drain region of a second conductivity type; a first gate electrode disposed adjacent to the drain region to cover the intrinsic region; a second gate electrode spaced apart from the first gate electrode and disposed adjacent to the source region to cover the intrinsic region; a first gate electrode disposed between the first gate electrode and the intrinsic region; and a second gate insulating layer disposed between the second gate electrode and the intrinsic region, the operating method comprising:

applying a gate bias voltage to the second gate electrode;
applying a first gate voltage to the first gate electrode and applying a first drain voltage to the drain region to write a first logic state such that the first memory device indicates the first logic state while the gate bias voltage is applied;
applying a second gate voltage to the first gate electrode and applying a second drain voltage to the drain region such that the first logic state is maintained while the gate bias voltage is applied;
applying the second gate voltage to the first gate electrode and applying the drain voltage to the drain region such that the first logic state is read while the gate bias voltage is applied;
applying a third gate voltage to the first gate electrode and applying the first drain voltage to the drain region to write a second logic state such that the memory device indicates the second logic state while the gate bias voltage is applied;
applying the second gate voltage to the first gate electrode and applying the second drain voltage to the drain region such that the second logic state is maintained while the gate bias voltage is applied; and
applying the second gate voltage to the first gate electrode and applying the first drain voltage to the drain region such that the second logic state is read while the gate bias voltage is applied.

14. The operating method as set forth in claim 13, wherein the first conductive layer is n-type, the second conductivity type is p-type,
the gate bias voltage is between −1 volt and −3 volts,
the first gate voltage is between 0.25 volt and 1 volt,
the second gate voltage is between −0.1 volt and 0.1 volt, and
the third gate voltage is between −0.25 volt and −1 volt.

15. An operating method of a memory device including a semiconductor column including a source region of a first conductivity type extending vertically on a substrate, a drain region of a second conductivity type, and an intrinsic region formed between the source region and the drain region; a first gate electrode disposed to cover the intrinsic region; a second gate electrode spaced vertically apart from the first gate electrode and disposed to cover the intrinsic region; a first gate insulating layer disposed between the first gate electrode and the intrinsic region; a first charge storage layer; a first auxiliary gate insulating layer; a second gate insulating layer disposed between the second gate electrode and the intrinsic region; a second charge layer; and a second auxiliary gate insulating layer, the operating method comprising:

applying a first gate voltage to the first gate electrode and applying a first drain voltage to the drain region to write first logic state such that the memory device indicates the first logic state;
applying a second gate voltage to the second gate electrode and applying a second drain voltage to the drain region such that the first logic state is maintained;
applying the second gate voltage to the first gate electrode and applying the first drain voltage to the drain region such that the first logic state is read;
applying a third gate voltage to the first gate electrode and applying the first drain voltage to the drain region such that the memory device indicates a second logic state;
applying the second gate voltage to the first gate electrode and applying the second drain voltage to the drain region such that the second logic state is maintained; and
applying the second gate voltage to the first gate electrode and applying the first drain voltage to the drain region such that the second logic state is read.

16. The operating method as set forth in claim 15, further comprising:

applying a program gate voltage to the second gate electrode and applying a drain voltage to the source region such that charges are injected into the second charge storage layer; and
applying an erase gate voltage to the second gate voltage such that the charge injected into the second charge storage layer are removed.

17. The operating method as set forth in claim 15, wherein the first conductive layer is n-type, the second conductivity type is p-type,
the first gate voltage is between −0.25 volt and −1 volt,
the second gate voltage is between −0.1 volt and 0.1 volt, and
the third gate voltage is between 0.25 volt and 1 volt.

* * * * *